United States Patent
Shimizu et al.

[11] Patent Number: 6,160,297
[45] Date of Patent: Dec. 12, 2000

[54] SEMICONDUCTOR MEMORY DEVICE HAVING A FIRST SOURCE LINE ARRANGED BETWEEN A MEMORY CELL STRING AND BIT LINES IN THE DIRECTION CROSSING THE BIT LINES AND A SECOND SOURCE LINE ARRANGED IN PARALLEL TO THE BIT LINES

[75] Inventors: Kazuhiro Shimizu; Hiroshi Watanabe, both of Yokohama; Yuji Takeuchi, Kawasaki; Seiichi Aritome; Toshiharu Watanabe, both of Yokohama, all of Japan

[73] Assignee: Kabushiki Kaisha Toshiba, Kawasaki, Japan

[21] Appl. No.: 09/017,803

[22] Filed: Feb. 3, 1998

[30] Foreign Application Priority Data

Feb. 10, 1997 [JP] Japan .................................. 9-026458

[51] Int. Cl.⁷ .............................. H01L 29/76; H01L 29/94
[52] U.S. Cl. ........................ 257/390; 257/315; 257/396; 257/748; 257/754; 257/756; 257/758; 257/765; 257/774; 257/775; 257/776
[58] Field of Search .................................... 257/390, 315, 257/396, 748, 754, 756, 758, 765, 774–776

[56] References Cited

U.S. PATENT DOCUMENTS

| | | |
|---|---|---|
| 5,204,286 | 4/1993 | Doan ........................................ 437/195 |
| 5,323,048 | 6/1994 | Onuma ...................................... 257/390 |
| 5,442,236 | 8/1995 | Fukazawa ................................ 257/758 |
| 5,519,239 | 5/1996 | Chu .......................................... 257/314 |
| 5,654,577 | 8/1997 | Nakamura et al. ...................... 257/392 |
| 5,710,462 | 1/1998 | Mizushima .............................. 257/758 |
| 5,717,251 | 2/1998 | Hayashi et al. ......................... 257/758 |
| 5,734,187 | 3/1998 | Bohr et al. .............................. 257/377 |

FOREIGN PATENT DOCUMENTS

| | | |
|---|---|---|
| 63-268193 | 11/1988 | Japan . |
| 7-074326 | 3/1995 | Japan ............................ H01L 27/115 |
| 7-74326 | 3/1995 | Japan . |

OTHER PUBLICATIONS

S. Aritome, et al., "A 0.67um² Self–Aligned Shallow Trench Isolation Cell (SA–STI Cell) for 3V–only 256Mbit Nand EEPROMs", 1994 IEEE, IEDM 94–61.

*Primary Examiner*—Sheila V. Clark
*Assistant Examiner*—Matthew E. Warren
*Attorney, Agent, or Firm*—Banner & Witcoff, Ltd.

[57] ABSTRACT

A semiconductor device comprises select gates and control gates of a plurality of memory cells therebetween so that gate members on upper portions of stacked gates may cross element regions. A metal interconnection is disposed parallel to an upper layer of the element region. A source line SL is arranged at intervals of plural bit lines BL. The source line is led to a source line contact through a conductive member composed of a low-resistance metal in the same manner as a bit line contact.

15 Claims, 39 Drawing Sheets

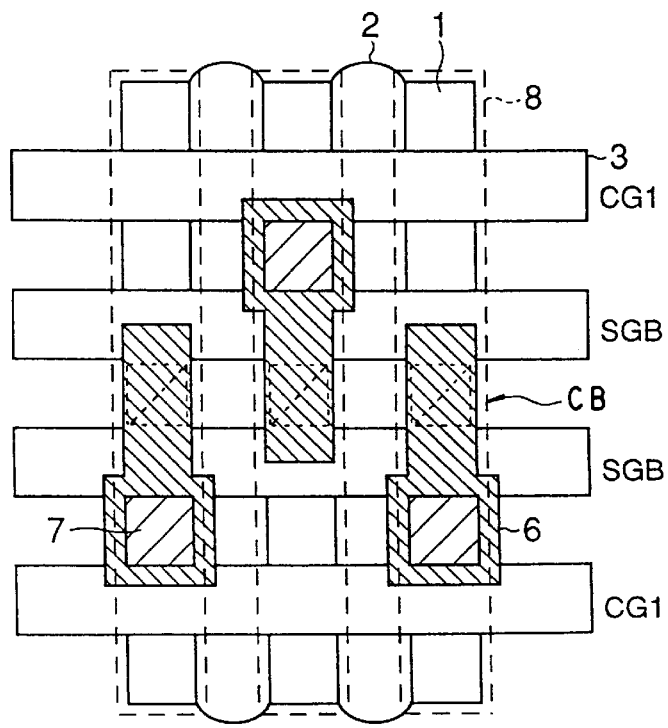
F I G. 20

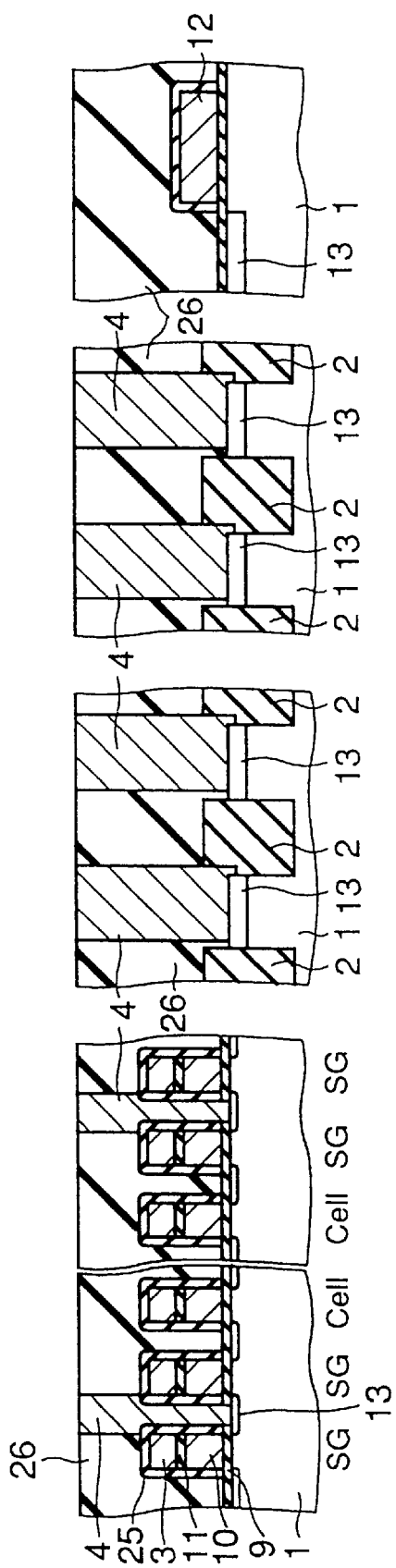
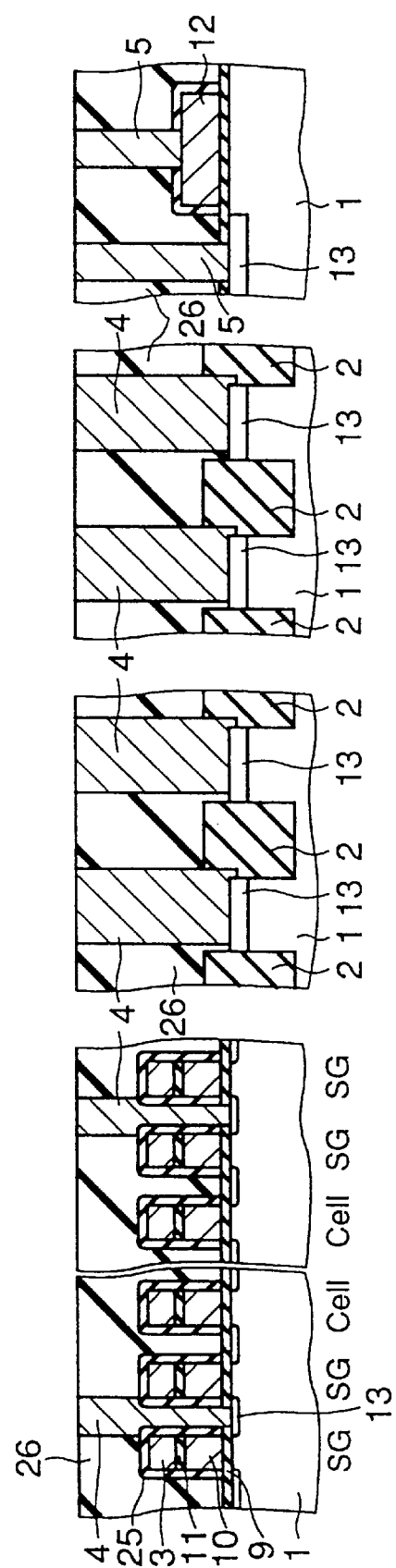

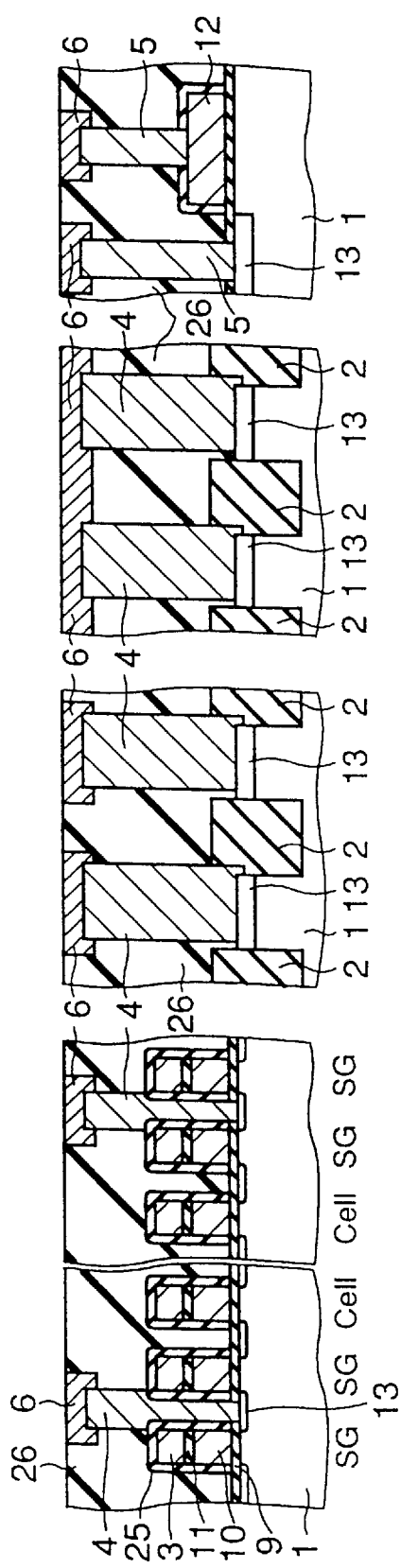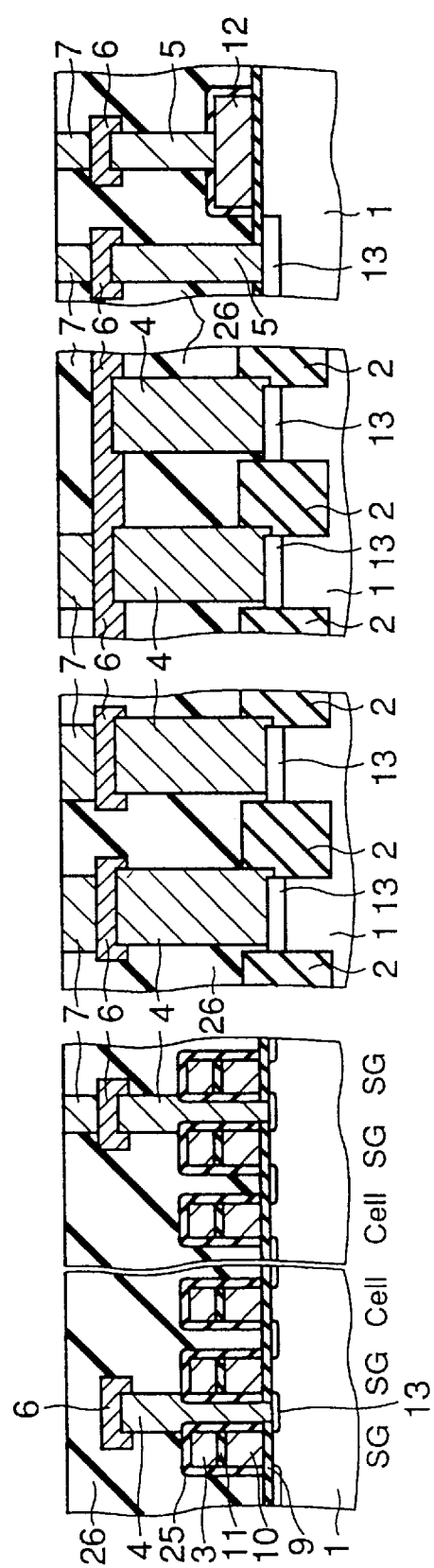

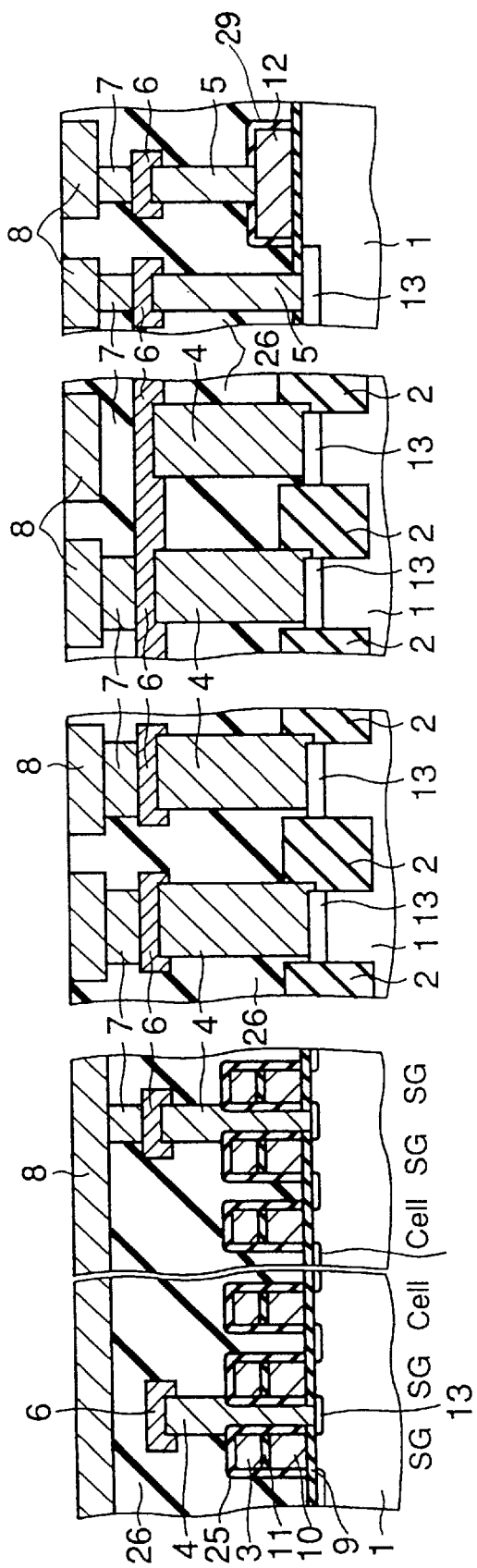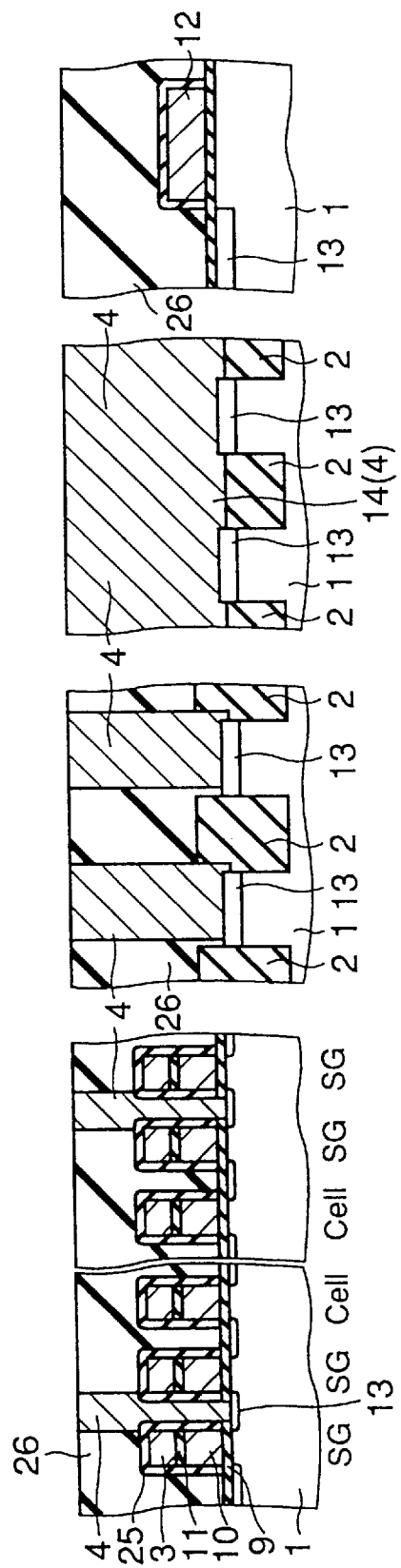

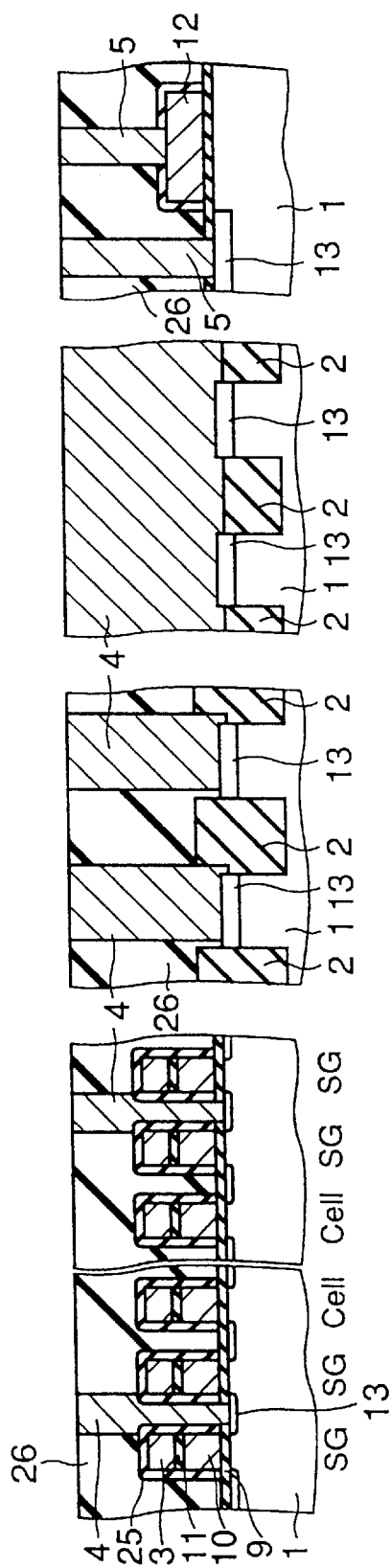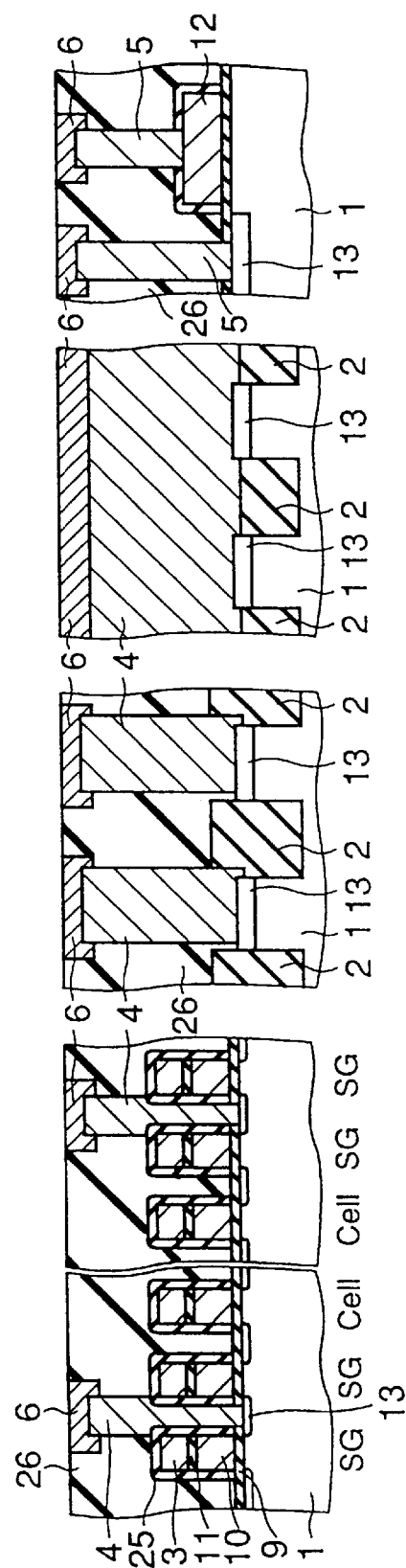

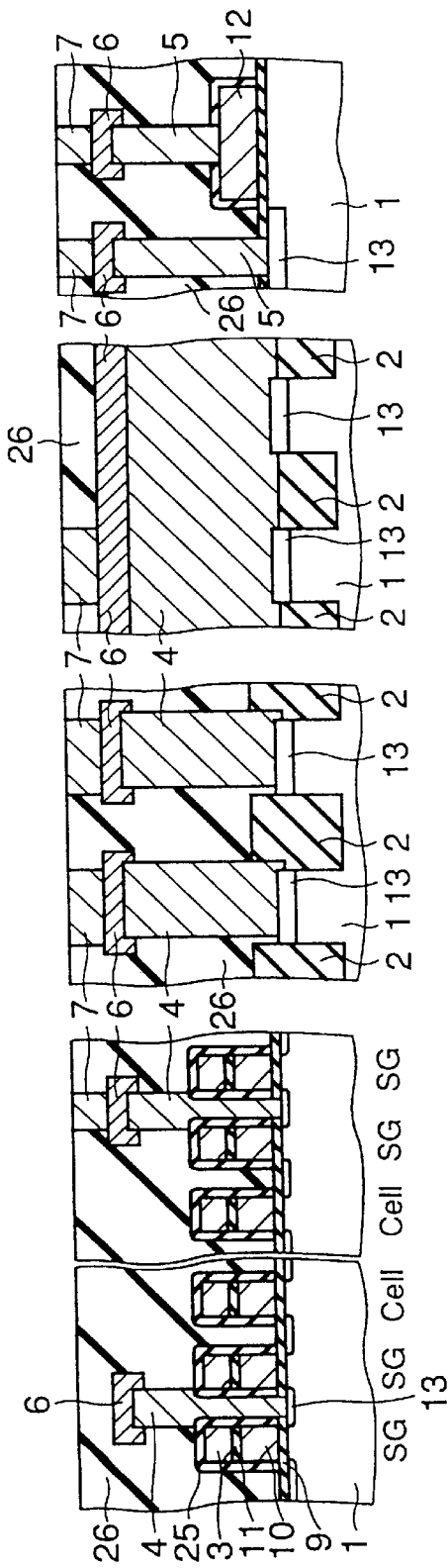
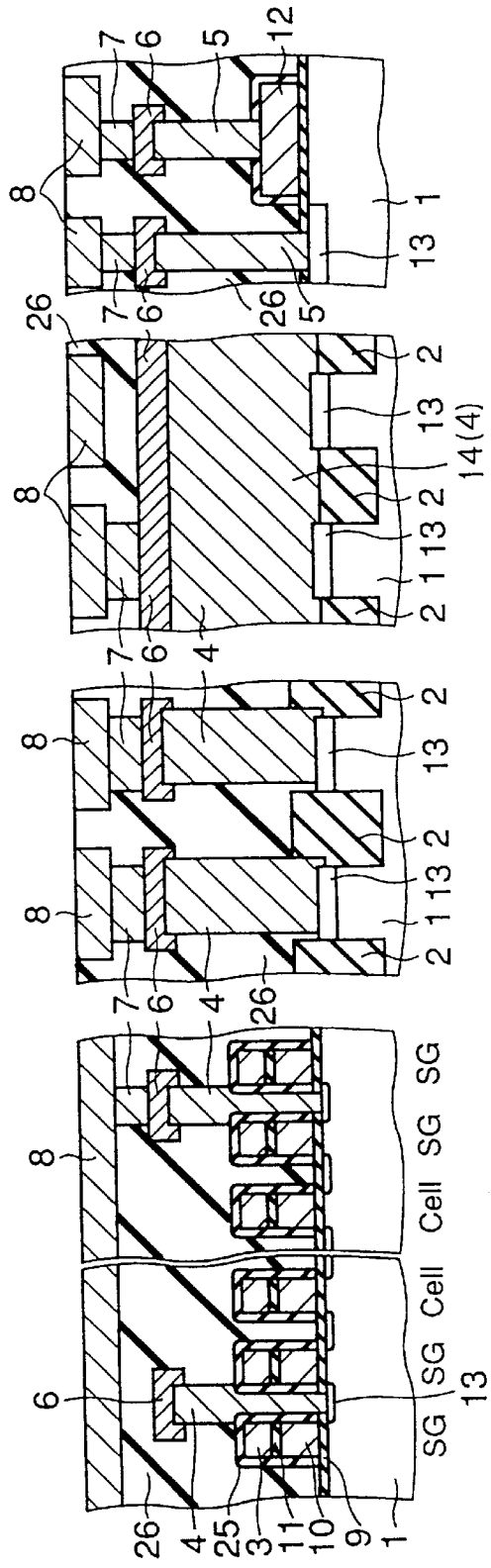

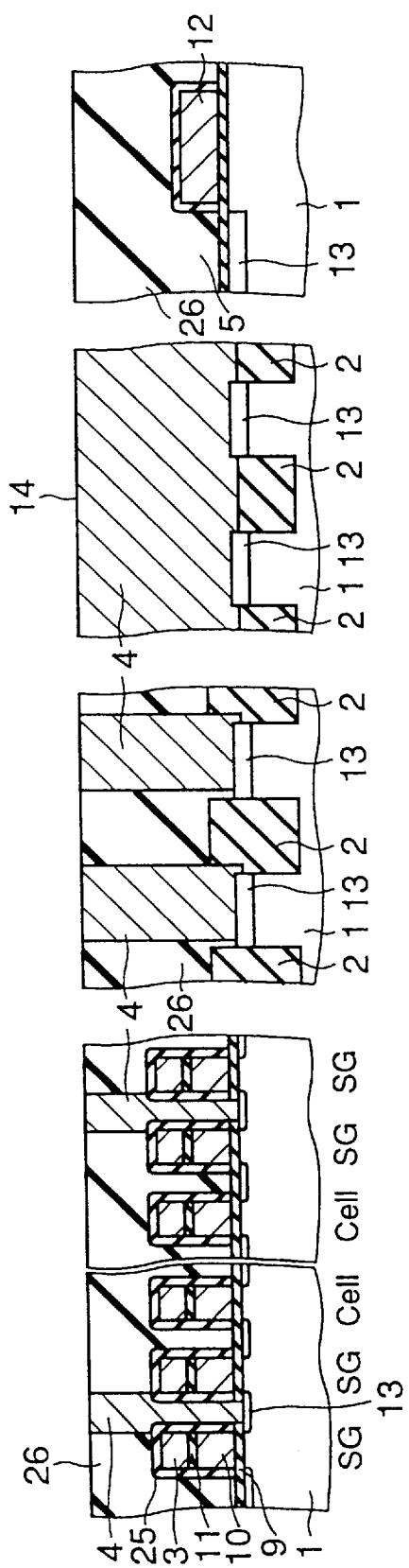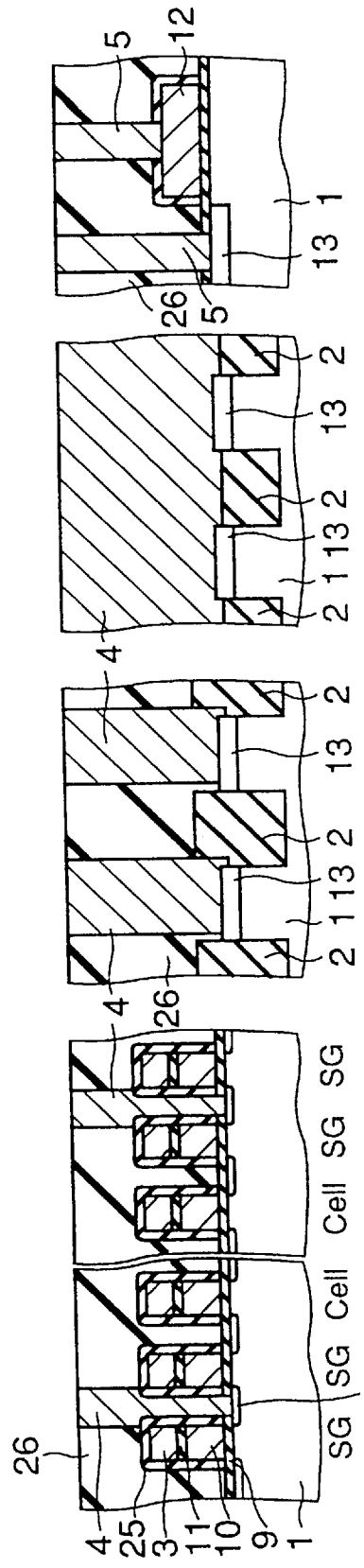

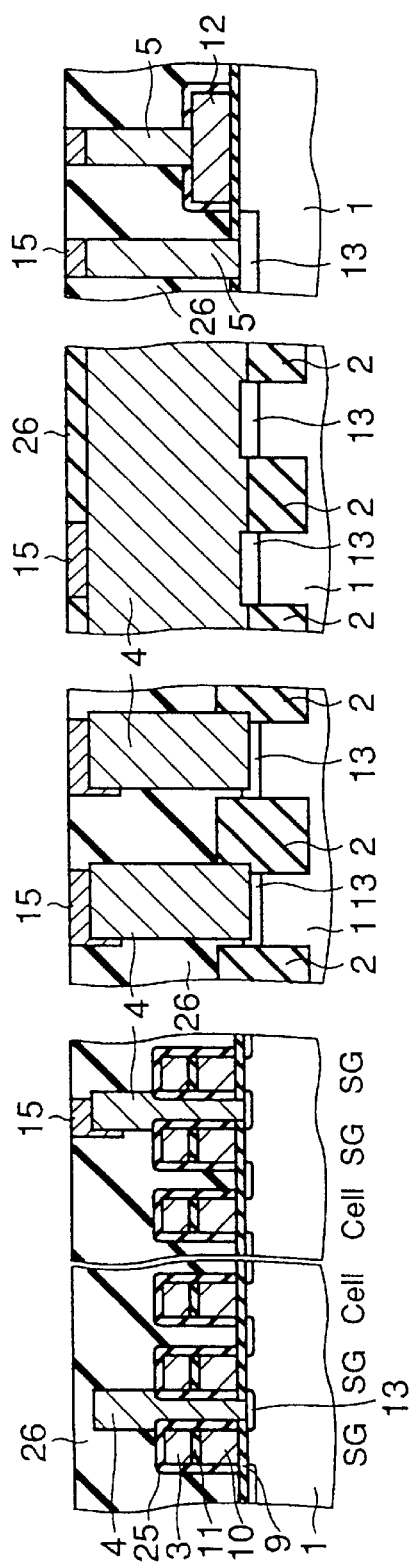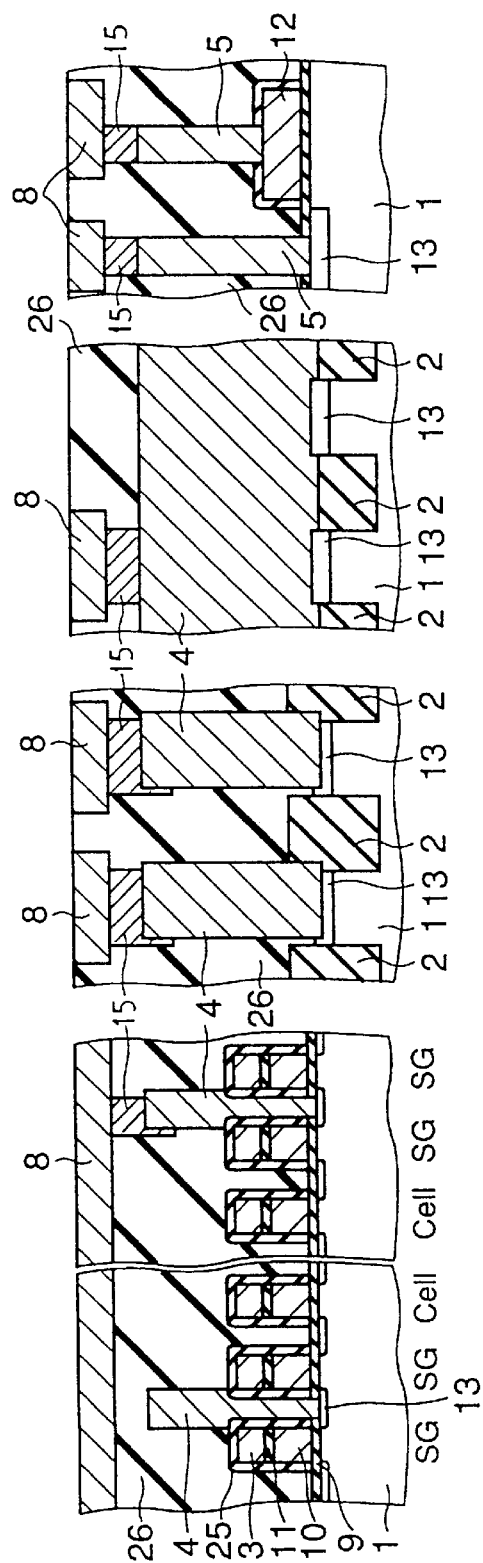

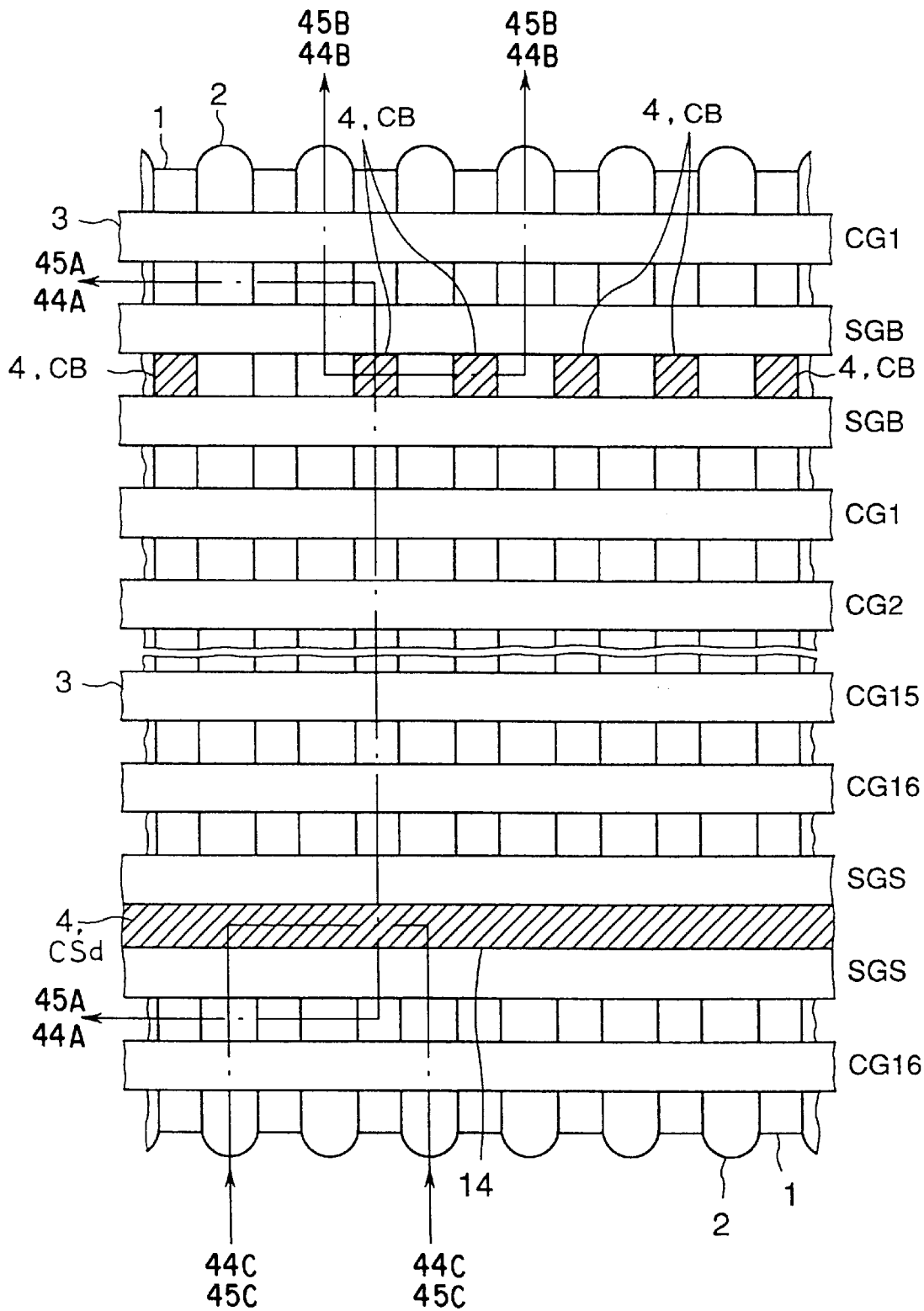
F I G. 40

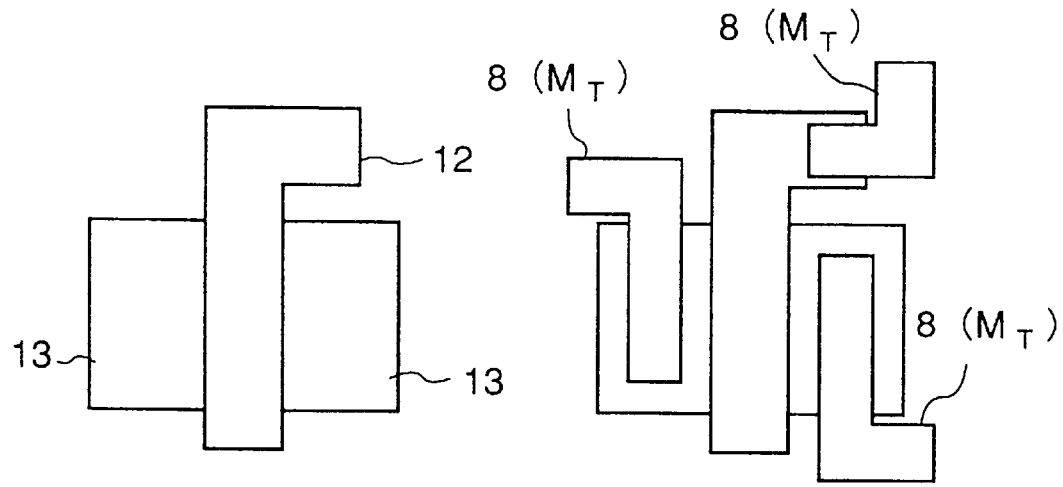
FIG. 43A
FIG. 43D
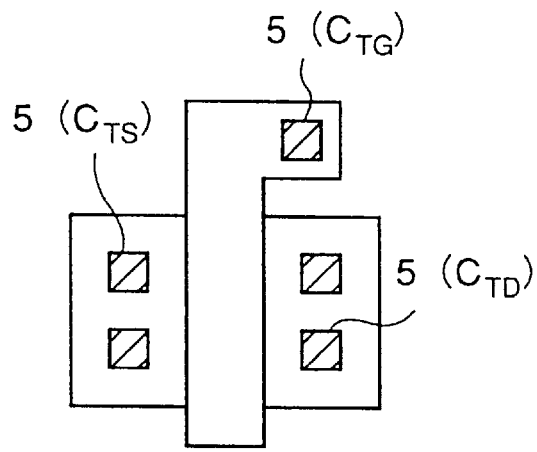
FIG. 43B
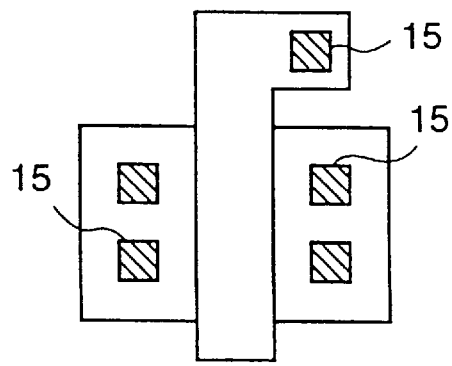
FIG. 43C

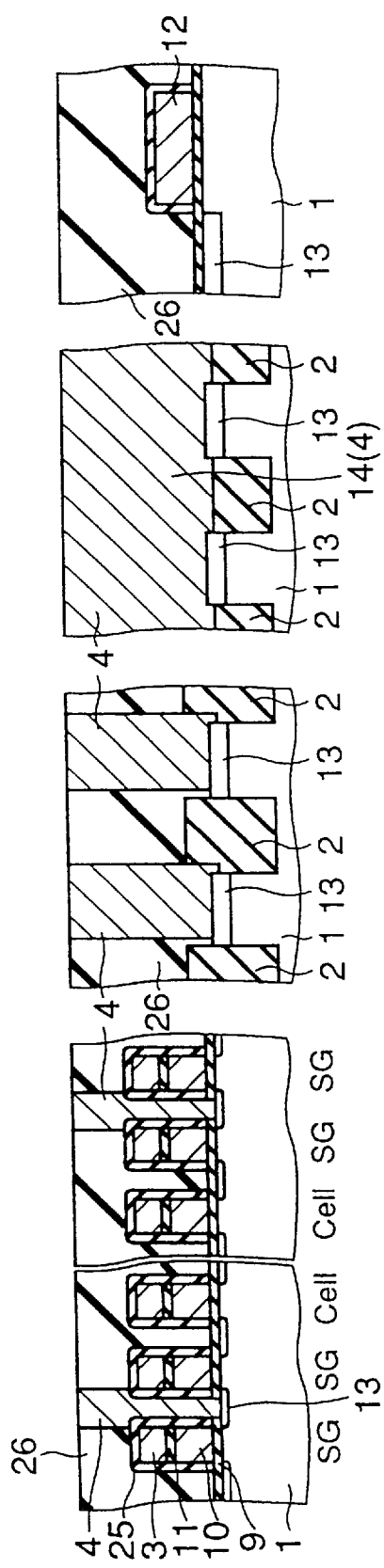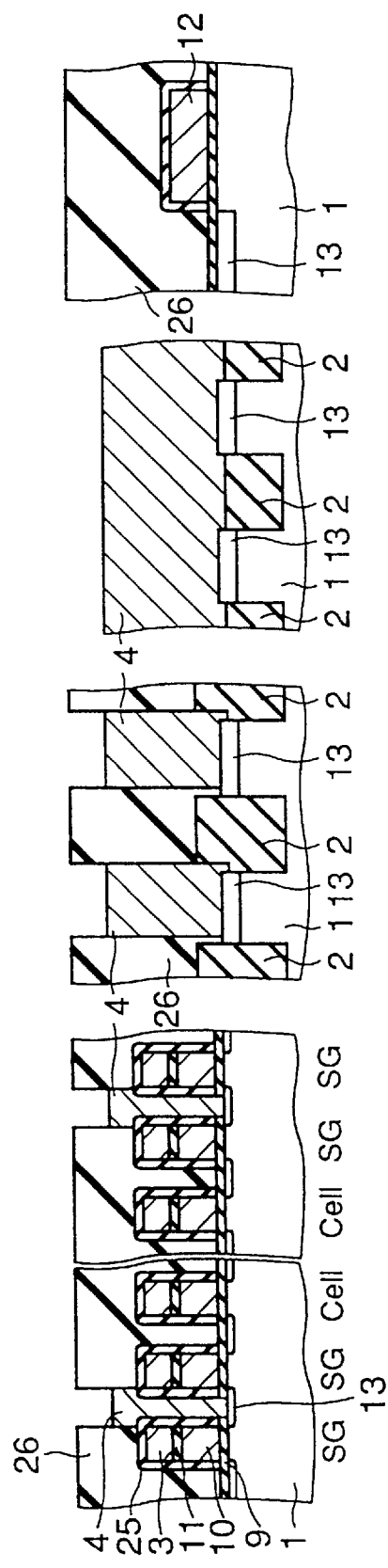

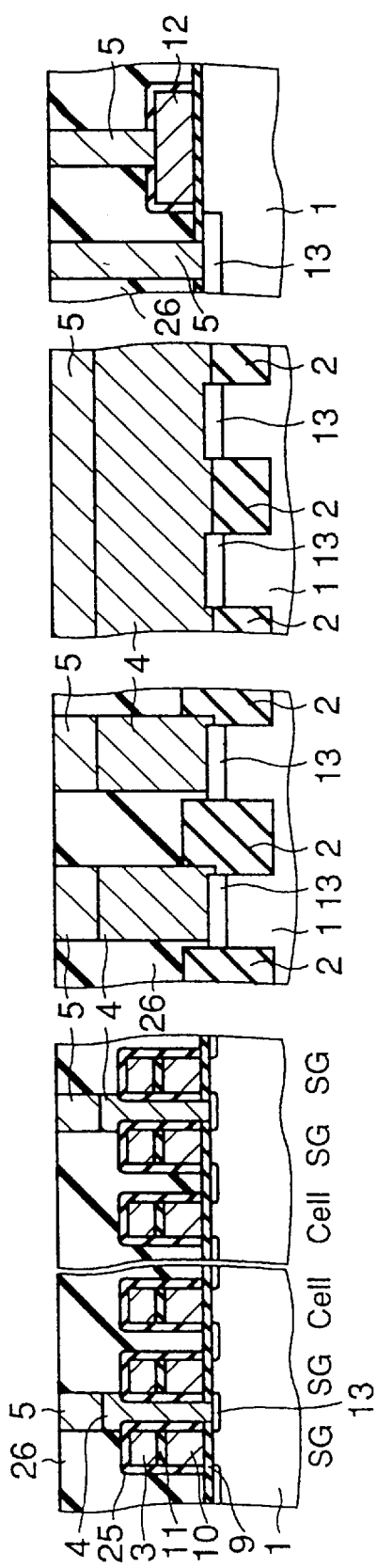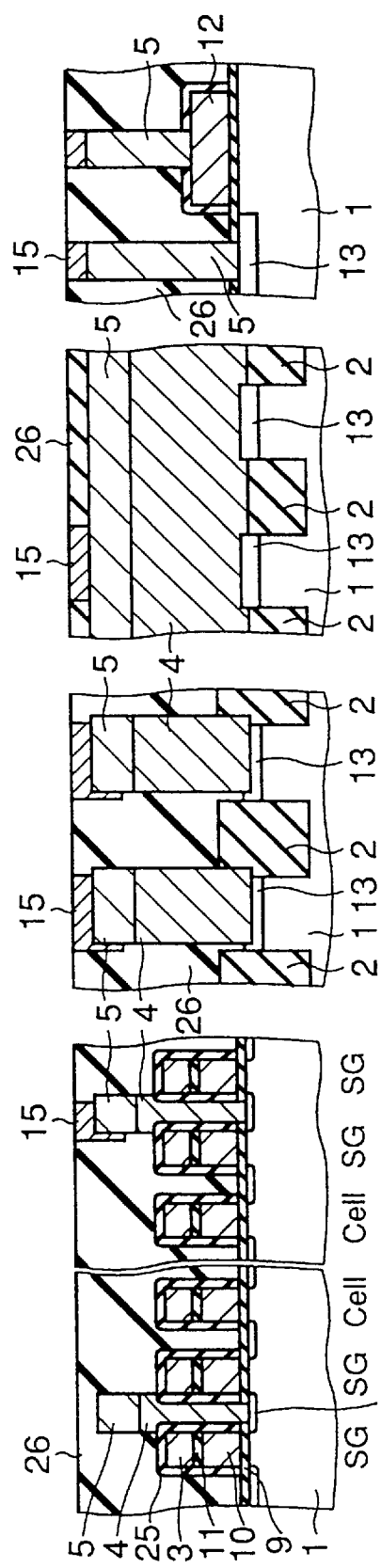

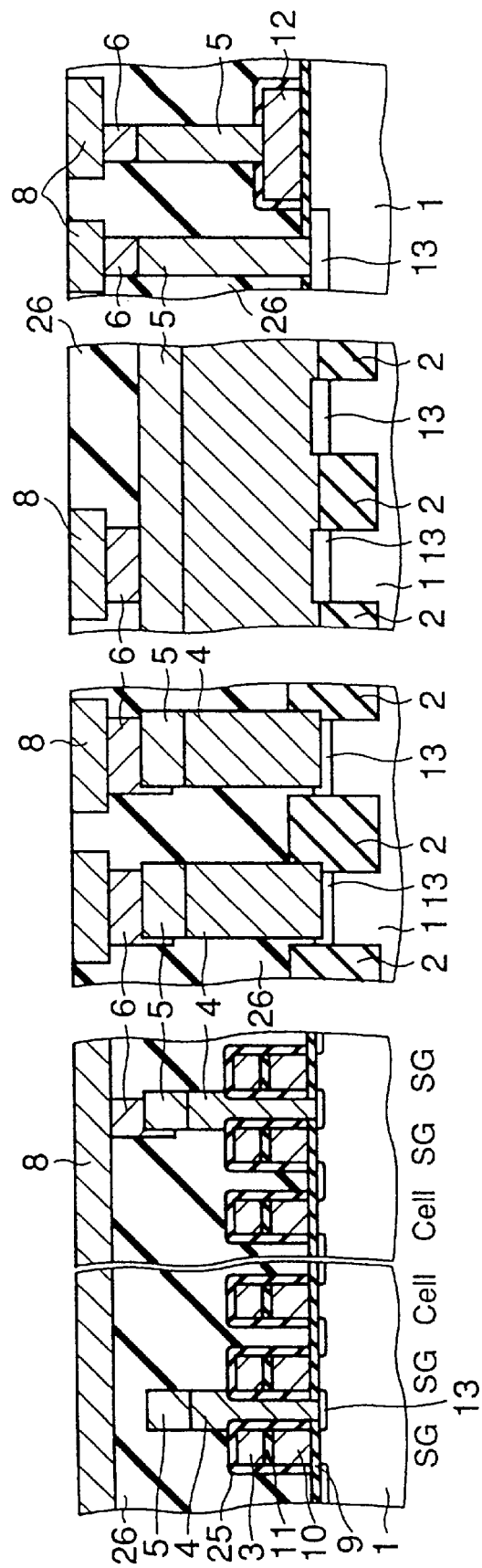

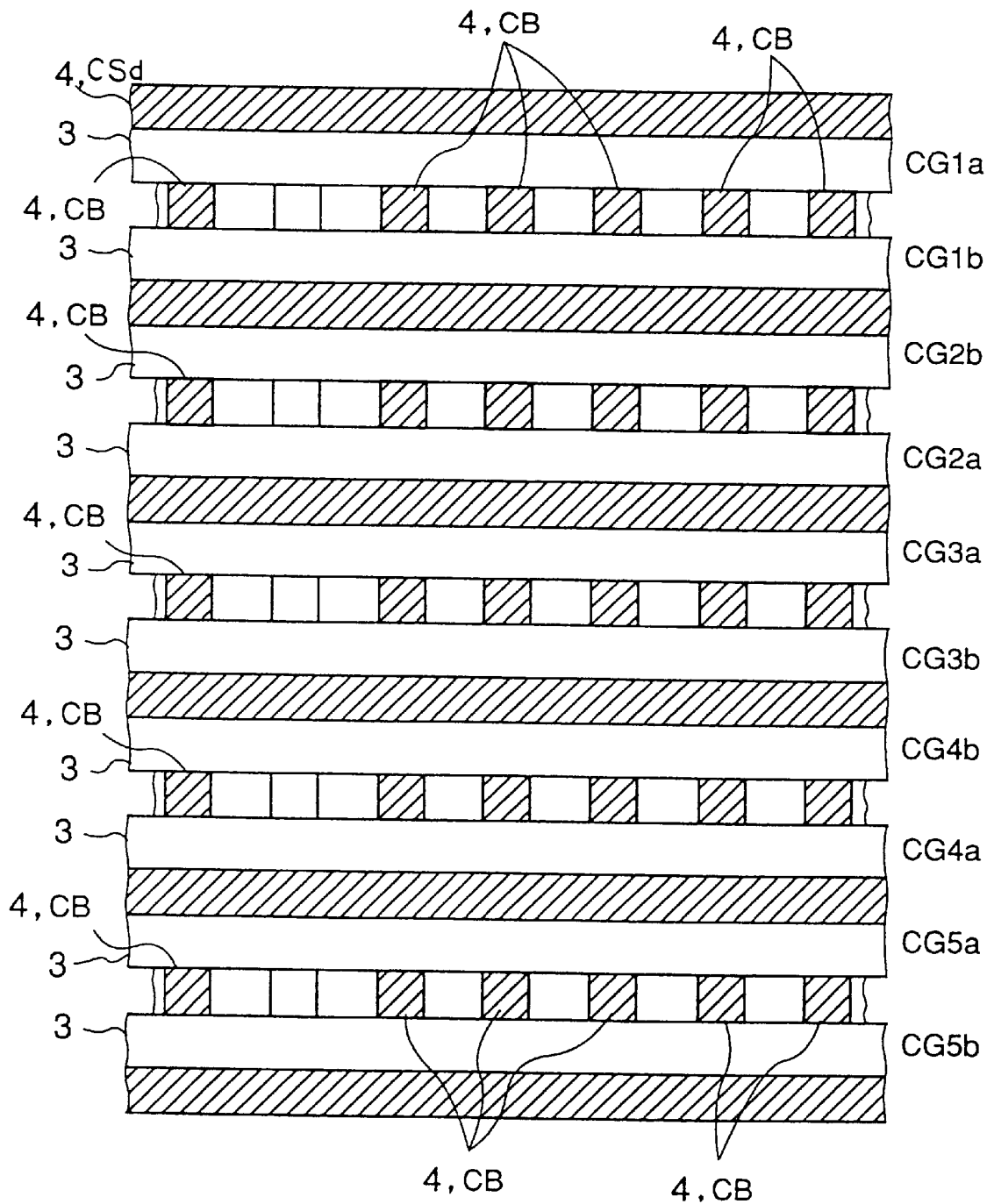
F I G. 50

SEMICONDUCTOR MEMORY DEVICE HAVING A FIRST SOURCE LINE ARRANGED BETWEEN A MEMORY CELL STRING AND BIT LINES IN THE DIRECTION CROSSING THE BIT LINES AND A SECOND SOURCE LINE ARRANGED IN PARALLEL TO THE BIT LINES

BACKGROUND OF THE INVENTION

The present invention relates to a semiconductor device which is advantageous to a fine formation, and specifically to an improvement of a contact technique and an interconnecting technique for a non-volatile semiconductor storage.

The fine formation of a semiconductor element is important to accomplish a large capacity and a high speed of the semiconductor device, specifically a semiconductor memory. This demand is significant for the large-capacity semiconductor memory such as a DRAM and an EEPROM.

The EEPROM is a non-volatile semiconductor memory in which data can be electrically rewritten. Known is the EEPROM using a memory cell of a MOS transistor structure having a stacked layer structure having a charge storage layer and a control gate.

FIGS. 1 and 2 show the structure of the memory cell of the EEPROM having a general MOS type FET arrangement. FIG. 1 is a plan view. FIG. 2 is a cross sectional view taken on line F2—F2 of FIG. 1.

An element separating/insulating film 17 is formed on a P-type silicon substrate or P-well 16. Under the film 17, a P$^+$-type layer 15 is formed as a channel stopper in the P-well 16. In such a manner, a thin first gate insulating film 18, which a tunnel current can flow through, is formed over a channel region surface on the P-type silicon substrate or P-well 16 in which the element is separated by a selective oxidation (LOCOS element separation).

A charge storage layer 19 is formed on this insulating film 18. A control gate 21 is also formed on this layer 19 through a second gate insulating film 20. The charge storage layer 19 and the control gate 21 are sequentially etched by the use of the same mask in a channel longitudinal direction, whereby their edges are arranged. These stacked gates 19 and 21 are then used as the mask so that an impurity is ion-implanted. An N$^+$-type layer 22 to be a source and a drain is thus formed.

FIG. 3 is a cross sectional view when a trench element separation is used. This cross section corresponds to a portion to be compared to a sectional portion of the cross sectional view shown in FIG. 2. A trench groove 17 for separating the element is formed on the P-type silicon substrate or P-well 16. An insulating material for use in the element separation, for example, an SiO$_2$ member 14 is buried in the trench groove 17.

A P$^+$-type layer 13 is formed as the channel stopper in a lower portion of the trench groove 17. In such a manner, the thin first gate insulating film 18, which the tunnel current can flow through, is formed over the channel region surface on the P-type silicon substrate or P-well 16 in which the element is separated by the trench groove 17. The charge storage layer 19 is formed on this insulating film 18. The control gate 21 is also formed on this layer 19 through the second gate insulating film 20.

The trench element separation is used, whereby the fine formation can be expected in a direction parallel to the control gate.

In a non-volatile semiconductor memory device using the memory cell as described above, the memory cells are arranged in series or in parallel, whereby some memory cell array arrangements are proposed and well known.

FIG. 4 is a plan view showing a conventional NOR type cell arrangement as an example of the memory cell array arrangements. The NOR type cell is arranged in the following manner. That is, the cells are connected in parallel to each other so that the drains of two memory cells 41a, 41b may be used in common, and the cells are arranged so that a bit line contact 42 may exist on a parallel connecting point.

In the above-described NOR type cell arrangement, a bit line contact portion is disposed on the semiconductor substrate in which the element is separated. The bit line contact portion is shared with two cell transistors. The element is not separated on a source side of the one cell transistor so that it is defined as a common interconnection (diffusion source region) 46.

This diffusion source region 46 is connected to a source line 48 through a source line contact 47.

The region of the bit line contact (drain contact) 42 and the diffusion source region 46 are N-type which is a polarity opposite to the above-mentioned semiconductor substrate or P-type well in which the cell transistor is disposed. The regions are doped with the impurity so that the impurity concentration thereof may reach a desired value as required.

In the NOR type cell, a write into the charge storage layer 19 by an electronic implantation is accomplished by the following procedure. For example, potentials of 10V and 5V are applied to a control gate (word line) 44 and a drain (bit line) 45, respectively. A channel hot electron is then generated by a transverse high electric field near the drain. This hot electron is implanted.

On the other hand, an erase operation by removal of the electron from the charge storage layer 19 is accomplished by the following procedure. For example, the potentials of 0V and 12V are applied to the control gate (word line) 44 and the source region (from the source line to the source diffusion region) 46, respectively. An F-N (Fowler-Nordheim) tunneling is then performed between the charge storage layer 19 overlapping with the source region and the source region 46.

In the memory cell array of such a NOR type cell arrangement, in order to accomplish the high speed and the large capacity, the fine formation by a reduction of dimension is strongly desired. The above-described trench element separation is effective for the fine formation in the longitudinal direction in which the control gate is arranged.

On the other hand, the reduction of a control gate length and a space between the control gates is very important for the fine formation in a direction perpendicular to the longitudinal direction in which the control gate 44 is arranged, that is, in the longitudinal direction in which the bit line 45 is arranged.

In the diffusion source region 46, the formation of a common source line in parallel to the control gate 44 and between the control gates 44 causes a significant problem for the fine formation of the memory cell. For example, assuming that a minimum dimension is 0.25 µm, the element separating region 43 has a longitudinal width of an addition of the word line (control gate) length of the two memory cells 41a, 41b, the width of the bit line contact 42 and an allowance between the control gate 44 and the bit line contact 42. For example, assuming that the control gate length is 0.25 µm, the bit line contact is 0.3 µm in size and the allowance between the bit line contact 42 and the control gate 44 is 0.15 µm, the longitudinal width of the element separating region 46 is 1.1 µm.

On the other hand, the width of an element separating region 43 in a short direction is equal to the width of the element separating region, for example, 0.25 μm. It is very difficult to transfer such a fine pattern by the use of a lithography technique and to form a thick field insulating film or the trench groove. An influence such as a proximity effect and a resist stretch causes a pattern distortion.

More specifically, the distortion of the longitudinal dimension of the gate causes a difference in dimension between the diffusion source region 46 and the control gate 44. This may thus cause a variation in a threshold voltage contributing to the variation in the erase operation or the like. This is a serious problem.

In order to solve such a problem, a Self-Aligned-Source (SAS) method has been heretofore used. FIGS. 5 and 6 are cross sectional views taken on line F5/6—F5/6 of FIG. 4. FIGS. 5 and 6 show an example of the memory cell array in case of using the SAS method.

An element separating film 50 ($SiO_2$) to be the element separating region is disposed parallel to a direction of the bit line. A charge storage layer 51 (F. G.: a floating gate), a gate insulating film 52 (ONO: a three-layer structure constituted by oxide film/nitride film/oxide film) and a control gate (word line) 53 (a stacked layer structure constituted by polysilicon (POLY) and WSi) are then formed.

At this time, a mask material 54 other than $SiO_2$, for example, SiN is disposed on the control gate 53. After the control gate 53 is formed, the whole surface is coated with a resist 55. The region for forming the common source line is opened by the lithography and thus an opening 56 is formed.

As shown in FIG. 6, a dry etching is performed by the use of a RIE condition of $SiO_2$ having a higher selectivity ratio with respect to the mask 54 (SiN and Si), whereby the element separating film 50 in the opening is removed. The condition of higher selectivity ratio allows the element separating film 50 to be removed without grinding the control gate 53 and the semiconductor substrate. The diffusion source region 56 can be thus formed in such a manner that the region 56 and the control gate 53 are not misaligned.

After the etching, a resist pattern is formed so that the diffusion source region 56 may be opened again by the lithography technique. An N-type impurity such as phosphorous and arsenic is ion-implanted, whereby the common diffusion source region 56 is formed.

The use of the SAS method permits the fine formation in the direction of the bit line.

However, in the SAS method, once the element is separated, the element separating film 50 is partially removed. The ion implantation of the impurity is then performed, whereby the diffusion source region 56 is formed. Thus, when a trench element separating method is used, it is difficult to form the source line. In the aforementioned NOR type cell, a writing method employing a channel hot electron implantation is generally used. A punch-through pressure resistance between the trench-element-separated bit line contacts is therefore required to be higher than the voltage (about 6V) applied to a drain portion of the memory cell during the write operation. Thus, the trench groove must have a depth (300–400 nm) similar to a thickness of a field oxide film formed by the conventional selective oxidation, the so-called LOCOS element separation. After the removal of $SiO_2$ in the trench groove, the trench groove has a difference in level of one depth of the trench groove. Thus, even if the ion implantation is performed, a problem occurs in which the source line is not formed.

Furthermore, when a 0.25 μm rule is used, the control gate length is about 0.25 μm. Thus, when the high-concentration impurity of $1 \times 10^{15}$ $cm^{-2}$ or more is ion-implanted into the source region so as to self-match with the control gate, the impurity is diffused under the control gate due to a heat treatment after the implantation. As a result, an effective channel length becomes shorter. Thus, another problem occurs in which punch through is caused. The ion-implantation of the high-concentration impurity into the source line is therefore expected to be very difficult. This causes a difficulty in forming the source line and an increase of a source line resistance. A further problem such as the reduction of a cell current and the variation in the threshold voltage occurs.

FIG. 7 is a plan view showing the arrangement of a NAND type cell in which a plurality of memory cells are connected in series so that they may share the source and drain diffusion layers thereof.

The NAND type cell arrangement can reduce an area occupied by the cell so that the area may be smaller than the area of the above-described NOR type cell arrangement (for example, Jpn. Pat. Appln. KOKAI Publication No. 63-268193).

In a single NAND cell group in which memory cell transistors MC1 to MC8 are connected in series, the element is linearly separated along the direction of the bit line. A hatched portion shows the charge storage layer (floating gate FG) 19 under the control gate (word line) 21. A drain D on one end of the single NAND cell group is connected to the bit line (not shown) through a select gate transistor SG1 (a bit line contact BC). The source on the other side thereof is connected to a diffusion source line S through another select gate transistor SG2.

One bit line contact BC is disposed in each NAND cell group. In the diffusion source line, the element is not separated, and all the NAND cell groups are connected to each other by the common source line.

In the memory cell of the NAND type cell arrangement, both of the erase and the write operations use an exchange of charge between the charge storage layer and the substrate.

FIG. 8 shows a non-selected bit line Vm8 applying type program. FIG. 9 shows an operating potential relationship of the memory cell array of the NAND cell arrangement and shows a non-selected bit line floating type program.

An erasing operation is performed in the following manner. That is, in FIGS. 8 and 9, a low potential (for example, 0V) is applied to the control gate in the same and common manner. A high potential (for example, 20V) is applied to the source, the drain and the substrate. By the use of a tunnel phenomenon, the electron is discharged from the charge storage layer 19. The threshold voltage reaches a negative value, whereby the cell is changed into, for example, a "0" state.

On the other hand, at the time of the write into the gate, the high potential (for example, 20V) is applied to the control gate. The low potential (for example, 0V) is applied to the source, the drain and the substrate. The electron is implanted into the charge storage layer. The threshold voltage reaches a positive value, whereby the cell is changed into, for example, a "1" state.

In the NAND type cell arrangement, the write is simultaneously performed in all the transistors linked to the selected control gate. Accordingly, a "1" write cell for making the threshold voltage positive and a "0" write cell for leaving the threshold voltage negative are linked to the same control gate. In order to allow such a write to have selectivity, a writing method as described below is used.

In FIG. 8, the potential of 0V is applied to a bit line BL1 of the selected cell for the "1" write. An intermediate potential (for example, 8V) is applied to the bit line of the selected cell for the "0" write.

In order to transfer the intermediate potential to the selected cell, the voltage (for example, 10V) higher than an intermediate voltage is applied to the non-selected control gate. The voltage of 0V is applied to the gate of the select transistor on the source line side. At the time of the write, a through current passing between the bit line and the source line is caused to be absent so as to thereby improve a pressurizing ability of a peripheral pressurizing circuit for generating the intermediate voltage.

On the other hand, the voltage of 10V is applied to the gate of the select transistor on the bit line side in the same manner as the non-selected control gate, whereby the intermediate potential is transferred.

In FIG. 9, the low voltage (for example, 3V) is applied to the gate of the select transistor on the bit line side of the bit line for the "0" write. The low voltage (for example, 3V) is also applied to the bit line. In such a manner, a method of cutting off the select transistor is adopted.

The select transistor on the source side is cut off in the same manner in FIG. 8, whereby the whole bit line is changed into a floating state. In this state, when the high voltage (for example, 20V) is applied to the selected control gate, the potential of the control gate allows a channel potential of the non-selected cell for the "0" write to be also increased by a capacity coupling. The electric field applied to the non-selected cell for the "0" write is reduced, whereby the "1" write is suppressed. In order to effectively increase the channel potential of the non-selected cell for the "0" write, the intermediate potential (for example, 8V) is also applied to the non-selected control gate.

A read of data is accomplished by the use of the positive and negative values of the threshold voltage in the "1" and "0" states.

That is, the low potential (for example, 0V) is applied to the source and the selected control gate. The potential for the read (for example, 1V) is applied to the selected bit line BL1. Whether the state is "0" or "1" is determined in accordance with the presence of absence of the current passing through the cell transistor.

At this time, the voltage (for example, 5V) higher than the threshold voltage of the "1"-state cell transistor is applied to all the non-selected control gates so that all the non-selected cells linked to the selected bit line may be in an ON state.

As described above, in the EEPROM, the data erase and write is accomplished by the use of the tunnel current in the oxide film between the charge storage layer and the substrate. The channel is formed on an interface between the oxide film and the substrate just below the charge storage layer in the same manner, whereby the data is written.

In such a NAND type cell array arrangement, compared to the NOR type cell array arrangement, a single bit line contact may be disposed for some memory cells (for example, 16 memory cells). The area of a contact region is therefore reduced. Thus, a cell area can be significantly reduced. In other words, the NAND type cell array arrangement is intrinsically superior in the fine formation in the direction of the bit line.

Furthermore, if the trench element separation is used, it is possible to form the memory cell having the very small cell area. As described in "S. Aritome et al.: IEEE Tech. Dig. of IEDM, p. 61, 1994", in the trench-element-separated NAND cell, assuming that the rule is defined so that the minimum dimension may be 0.25 $\mu$m, the cell area can be reduced to 0.31 $\mu$m$^2$.

However, in the NAND type cell array arrangement, for example, the 0.25 $\mu$m rule is used. In this case, when the diffusion source line is doped with high-concentration impurity, the punch-through pressure resistance of the select transistor adjacent to the diffusion source line is considerably reduced. This causes the problem in which the transistor cannot be cut off during the write. Thus, it is necessary to limit a doping of the high-concentration impurity. The increase of the source line resistance cannot be avoided as is the case with the NOR type cell.

In the NAND type cell array, when the resistance of the diffusion source line becomes higher, a drop of the potential cannot be ignored on the diffusion source line. This causes a spread of threshold voltage distribution during the read. The diffusion source line is replaced by a metal bypass for some NAND arrays each, whereby it is wired. The interconnecting is carried out in order to reduce the resistance of the diffusion source line. However, since the metallic bit line exists on each NAND array, the contact cannot be disposed in each NAND array so as to shunt from the diffusion source line. Thus, the NAND array farthest from a shunt region is most significantly influenced by the resistance of the source line.

That is, during the write, if the selected memory cell in the above-mentioned NAND array is the earliest cell in the memory cells to be written, when the data is written in the earliest cell so as to thereby be in the "1" state, other cells remain "0" state. At this time, due to a verify read, the cell current of the NAND arrays other than the above-described NAND array is much greater than the cell current of the above-described NAND array. Therefore, a source potential of the above-described NAND array is reduced due to the source resistance and the cell current.

Thus, the threshold voltage of the selected cell in the above-described NAND array is apparently higher. Consequently, the write is completed at the voltage lower than the threshold voltage at which the write should be completed. This causes the spread of the threshold voltage distribution after the write.

Such a problem causes another problem described below. That is, when the two or more threshold voltages are set after the write into one memory cell whereby a multi-valued system is used so that one memory cell may have binary or more information, if the spread of the one threshold voltage distribution is larger, a writing voltage and a reading voltage become very high. This causes problems such as the considerable reduction of writing velocity and a disturbance of the cell.

It should be noted that the above-described diffusion source line may be generally referred to as a common signal line of the cell array. Therefore, the above problem is not limited to the non-volatile semiconductor memory device but relates to the semiconductor memory device or the general semiconductor device including the common signal line of the cell array. The array arrangement is not limited to the NOR type cell arrangement and the NAND type cell arrangement. Although the 0.25 $\mu$m rule is herein described, the present invention is not limited to this rule.

BRIEF SUMMARY OF THE INVENTION

The present invention is made in view of the above conditions. It is an object of the present invention to provide a semiconductor device in which, more specifically for a fine formation of a semiconductor element for accomplishing a large capacity and a high speed of a semiconductor memory, a source line is easily formed, a common signal line is included so that a resistance of the source line can be reduced, and a high reliability and a reduction of a memory cell array size can be accomplished at the same time.

In order to accomplish the above object, according to one aspect of the present invention, a semiconductor device comprises a semiconductor substrate; a plurality of element separating regions disposed on the semiconductor substrate; a plurality of first semiconductor regions, each being separated in a striped form by the plurality of element separating regions; a plurality of gate members crossing the plurality of first semiconductor regions and disposed keeping a predetermined space between one another in order to arrange memory cell arrays; second semiconductor regions disposed on surfaces of the plurality of first semiconductor regions between the plurality of gate members and having a conductive type opposite to the first semiconductor regions; an interlayer insulating film coating the memory cell arrays; first conductive members electrically connected to each of the second semiconductor regions between first adjacent gate members of the gate members and electrically connected to each of the second semiconductor regions between second adjacent gate members of the gate members; second conductive members disposed so as to be electrically connected to each of the first conductive members between the first adjacent gate members respectively and disposed along the gate members so as to be electrically connected in common to each of the first conductive members between the second adjacent gate members; and potential supply interconnections disposed so as to be separated from each other and to cross the gate members in order that each of the interconnections is electrically connected to a corresponding portion of each of the second conductive members respectively.

According to another aspect of the present invention, a semiconductor device comprises a semiconductor substrate; a plurality of element separating regions disposed on the semiconductor substrate; a plurality of first semiconductor regions separated by the plurality of element separating regions; a plurality of gate members crossing the plurality of first semiconductor regions and disposed keeping a predetermined space between one another in order to arrange memory cell arrays; second semiconductor regions disposed on surfaces of the plurality of first semiconductor regions between the plurality of gate members and having a conductive type opposite to the first semiconductor regions; an interlayer insulating film coating the memory cell arrays; a plurality of bit lines and source lines disposed along the plurality of first semiconductor regions on the interlayer insulating film the plurality of source lines being arranged at intervals of some of the plurality of bit lines; and conductive members individually disposed corresponding to each of the second semiconductor regions in order to connect the second semiconductor regions to the bit lines between first adjacent gate members of the gate members and disposed commonly corresponding to the second semiconductor regions in order to connect the second semiconductor regions to the source lines between second adjacent gate members of the gate members.

By the above-described arrangement, according to the semiconductor device of the present invention, the conductive member is buried in a bit line contact portion and a source line contact portion. The source line contacts are electrically connected to each other by another conductive member. Thus, in an integration adopting a trench element separation, without using the present SAS method having a fear of low reliability, it is possible to obtain the high-reliability semiconductor device capable of simultaneously accomplishing the reduction of a common signal line resistance and the reduction of a memory cell array size. Furthermore, a dimension control margin of the conductive member is increased. Moreover, another low-resistivity conductive member is buried in the same contact, whereby it is possible to obtain the semiconductor device which can be directed to the reduction of contact resistance and the reduction of signal line resistance without increasing the process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 15A to 15C and 15D are cross sectional views sequentially showing the process of manufacturing each arrangement shown in FIG. 10 and a cross sectional view corresponding to the manufacturing process shown in FIG. 14A, respectively;

FIGS. 16A to 16C and 16D are cross sectional views sequentially showing the process of manufacturing each arrangement shown in FIG. 10 following FIGS. 15A to 15C and a cross sectional view corresponding to the manufacturing process shown in FIG. 14B, respectively;

FIGS. 17A to 17C and 17D are cross sectional views sequentially showing the process of manufacturing each arrangement shown in FIG. 10 following FIGS. 16A to 16C and a cross sectional view corresponding to the manufacturing process shown in FIG. 14C, respectively;

FIGS. 18A to 18C and 18D are cross sectional views sequentially showing the process of manufacturing each arrangement shown in FIG. 10 following FIGS. 17A to 17C and a cross sectional view corresponding to the manufacturing process shown in FIG. 14D, respectively;

FIGS. 19A to 19C and 19D are cross sectional views sequentially showing the process of manufacturing each arrangement shown in FIG. 10 following FIGS. 18A to 18C and a cross sectional view corresponding to the manufacturing process shown in FIG. 14E, respectively;

FIG. 20 is a plan view showing a bit line contact CB showing a partial application example for a fine formation;

FIGS. 26A to 26C and 26D are cross sectional views taken on lines of figure numbers in the arrangement in the process of manufacturing the memory cell array shown in FIG. 22 and a cross sectional view of FIG. 25A, respectively;

FIGS. 27A to 27C and 27D are cross sectional views taken on lines of figure numbers in the arrangement in the process of manufacturing the memory cell array shown in FIG. 22 and a cross sectional view of FIG. 25B, respectively;

FIGS. 28A to 28C and 28D are cross sectional views taken on lines of figure numbers in the arrangement in the process of manufacturing the memory cell array shown in FIG. 23 and a cross sectional view of FIG. 25C, respectively;

FIGS. 29A to 29C and 29D are cross sectional views taken on lines of figure numbers in the arrangement in the process of manufacturing the memory cell array shown in FIG. 24 and a cross sectional view of FIG. 25D, respectively;

FIGS. 30A to 30C and 30D are cross sectional views taken on lines of figure numbers in the arrangement in the process of manufacturing the memory cell array shown in FIG. 21 and a cross sectional view of FIG. 25E, respectively;

FIGS. 35A to 35C and 35D are cross sectional views taken on lines of figure numbers in the arrangement in the process of manufacturing the memory cell array shown in FIG. 32 and a cross sectional view of FIG. 34A, respectively;

FIGS. 36A to 36C and 36D are cross sectional views taken on lines of figure numbers in the arrangement in the process of manufacturing the memory cell array shown in FIG. 32 and a cross sectional view of FIG. 34B, respectively;

FIGS. 37A to 37C and 37D are cross sectional views taken on lines of figure numbers in the arrangement in the process of manufacturing the memory cell array shown in FIG. 33 and a cross sectional view of FIG. 34C, respectively;

FIGS. 38A to 38C and 38D are cross sectional views taken on lines of figure numbers in the arrangement in the process of manufacturing the memory cell array shown in FIG. 31 and a cross sectional view of FIG. 34D, respectively;

FIGS. 40 to 42 are plan views sequentially showing the process of manufacturing the partial arrangement of the memory cell array shown in FIG. 39;

FIGS. 43A to 43D are plan views sequentially showing the process of manufacturing the peripheral transistor (MOS transistor) circuit formed together with the process of manufacturing the partial arrangement of the memory cell array shown in FIG. 39;

FIGS. 44A to 44C and 44D are cross sectional views taken on lines of figure numbers in the arrangement in the process of manufacturing the memory cell array shown in FIG. 40 and a cross sectional view of FIG. 43A, respectively;

FIGS. 45A to 45C and 45D are cross sectional views taken on lines of figure numbers in the arrangement in the process of manufacturing the memory cell array shown in FIG. 40 and a cross sectional view of FIG. 43A, respectively;

FIGS. 46A to 46C and 46D are cross sectional views taken on lines of figure numbers in the arrangement in the process of manufacturing the memory cell array shown in FIG. 41 and a cross sectional view of FIG. 43B, respectively;

FIGS. 47A to 47C and 47D are cross sectional views taken on lines of figure numbers in the arrangement in the process of manufacturing the memory cell array shown in FIG. 42 and a cross sectional view of FIG. 43C, respectively;

FIGS. 48A to 48C and 48D are cross sectional views taken on lines of figure numbers in the arrangement in the process of manufacturing the memory cell array shown in FIG. 39 and a cross sectional view of FIG. 43D, respectively;

FIGS. 50 to 52 are plan views sequentially showing the process of manufacturing the partial arrangement of the memory cell array shown in FIG. 49.

DETAILED DESCRIPTION OF THE INVENTION

Figure 1:
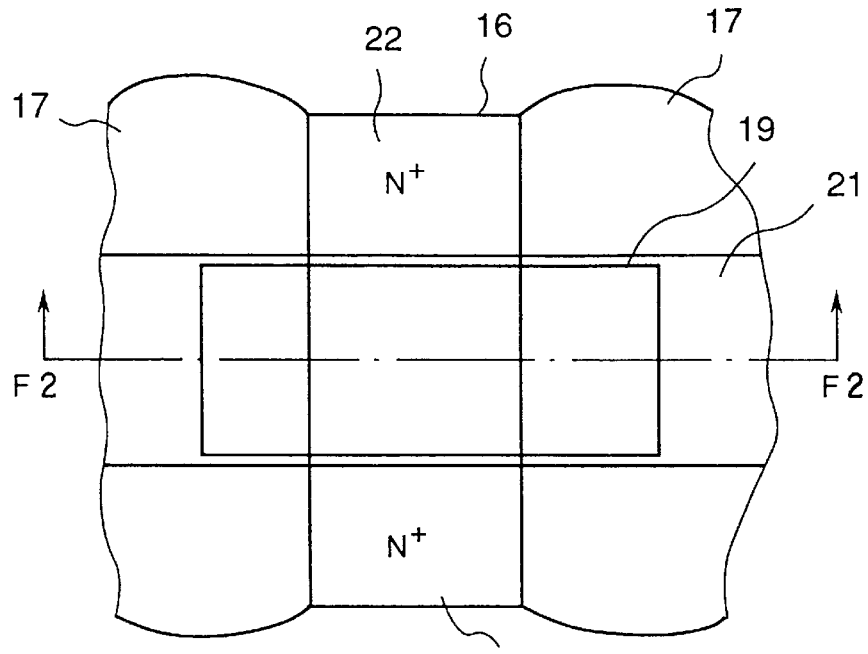
FIG. 1 is a plan view showing a memory cell structure of an EEPROM of a general MOS type FET arrangement which is one of the conventional EEPROMs.
Figure 2:
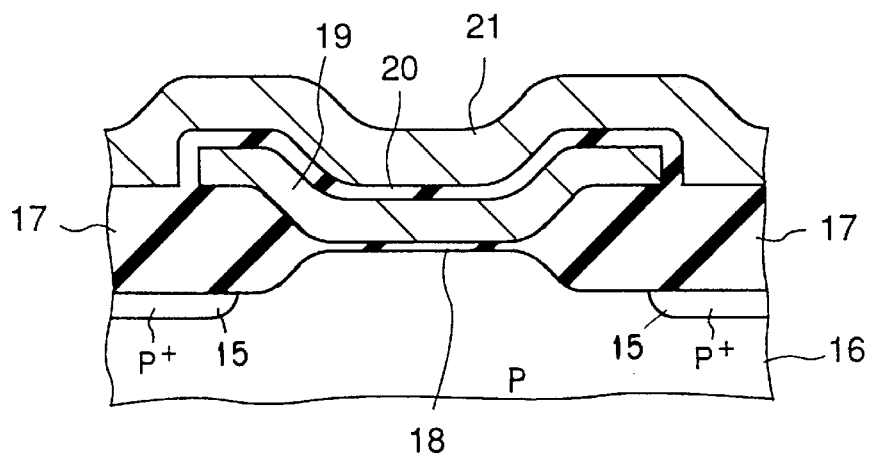
FIG. 2 is a cross sectional view taken on line F2—F2 of FIG. 1.
Figure 3:
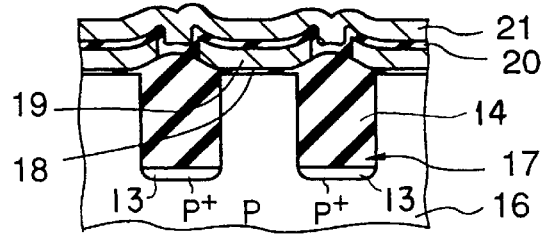
FIG. 3 is a cross sectional view in case of using a trench element separation.
Figure 4:
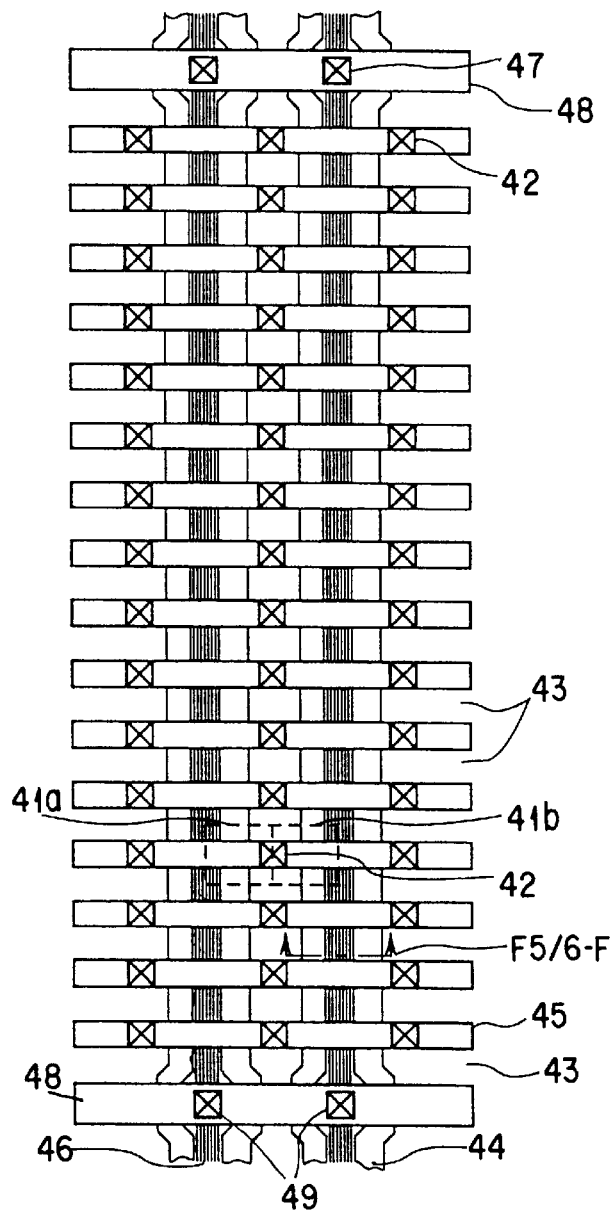
FIG. 4 is a plan view showing the arrangement of a conventional NOR type cell.
Figure 7:
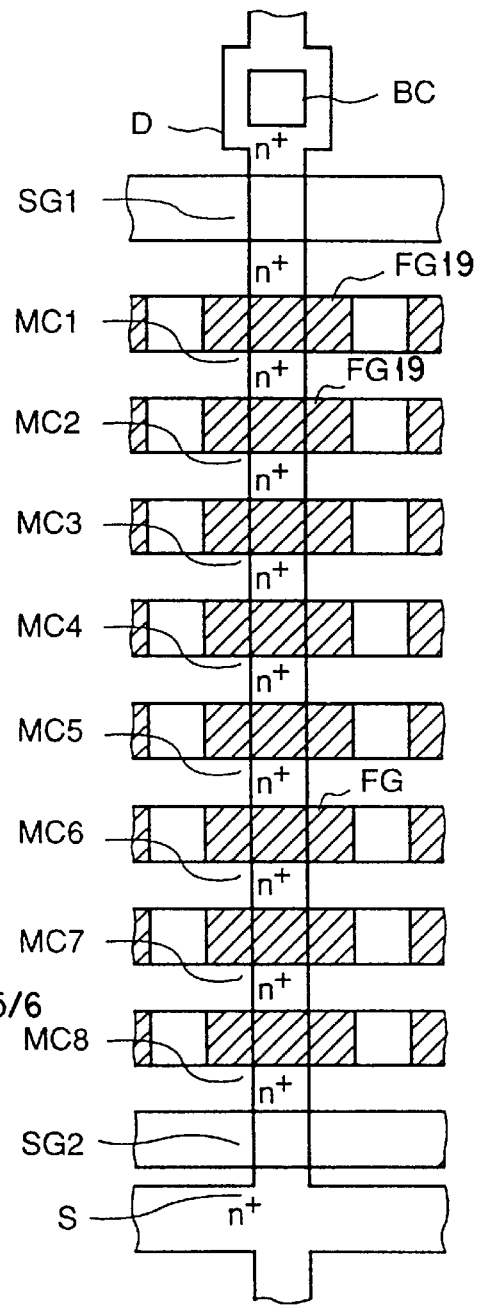
FIG. 7 is a plan view showing the arrangement of a conventional NAND type cell.
Figure 5:
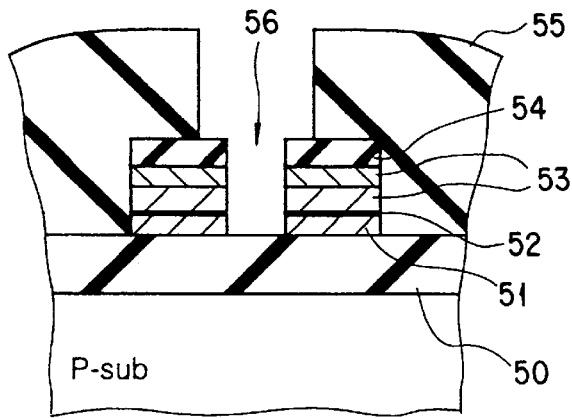
FIG. 5 is a cross sectional view taken on line F5/6—F5/6 of FIG. 4, showing a process of manufacturing a memory cell array in case of using an SAS (Self-Aligned-Source) method.
Figure 6:
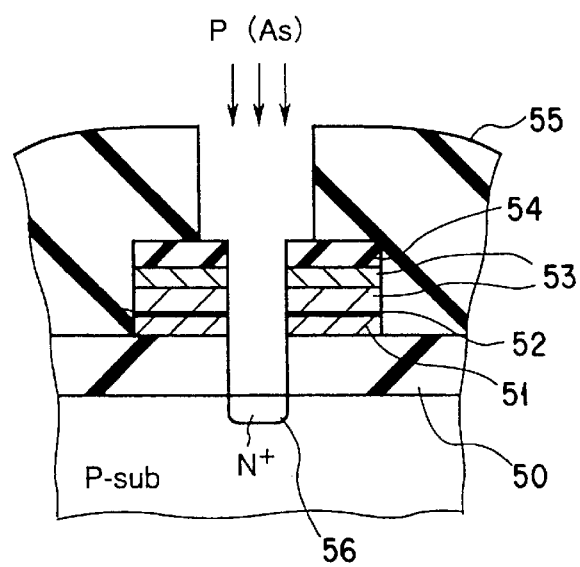
FIG. 6 is a cross sectional view taken on line F5/6—F5/6 of FIG. 4, showing the process of manufacturing the memory cell array following FIG. 5.
Figure 8:
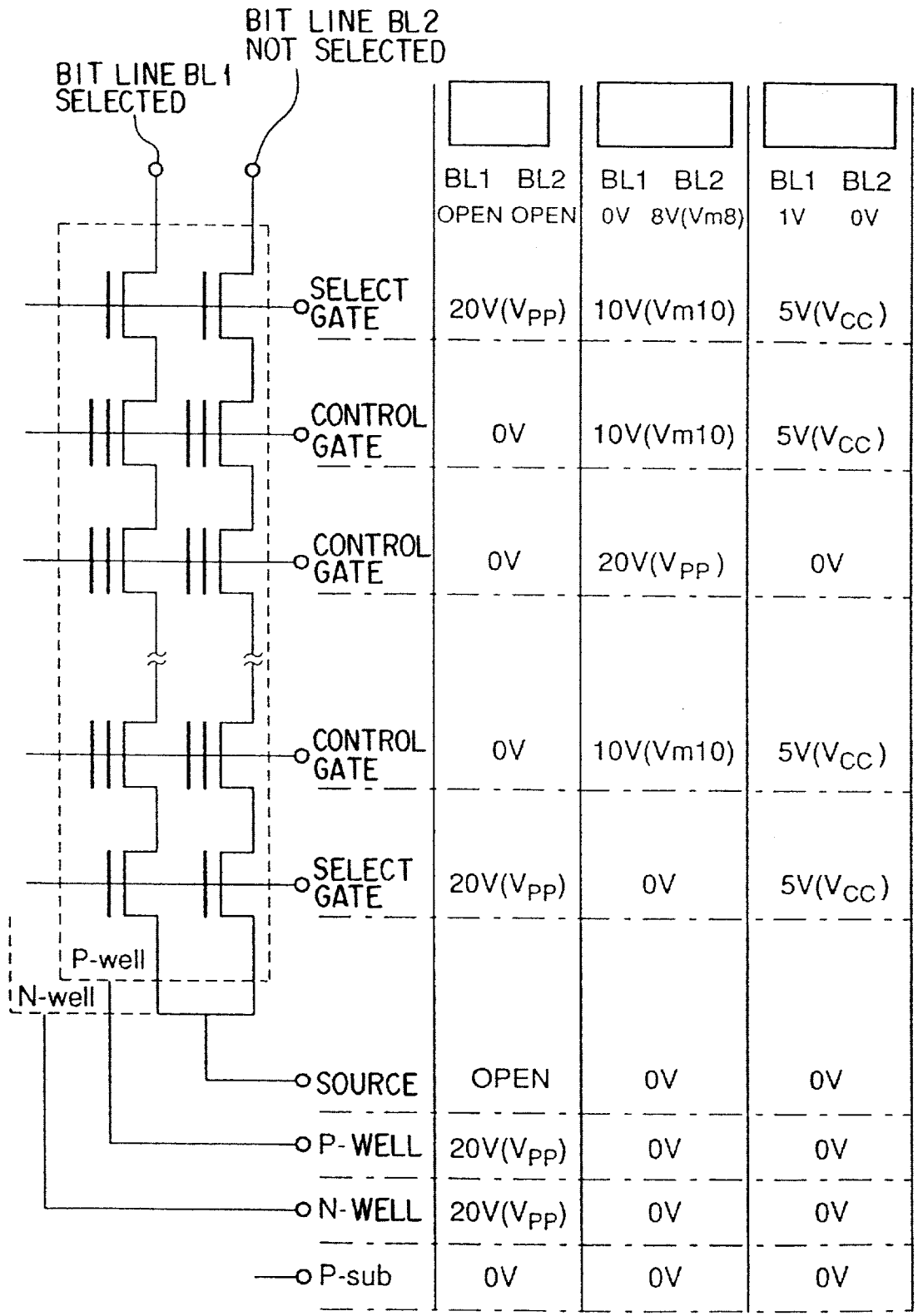
FIG. 8 shows an operating potential relationship of the memory cell array of the conventional NAND cell arrangement and shows a non-selected bit line Vm8 applying type program.
Figure 9:
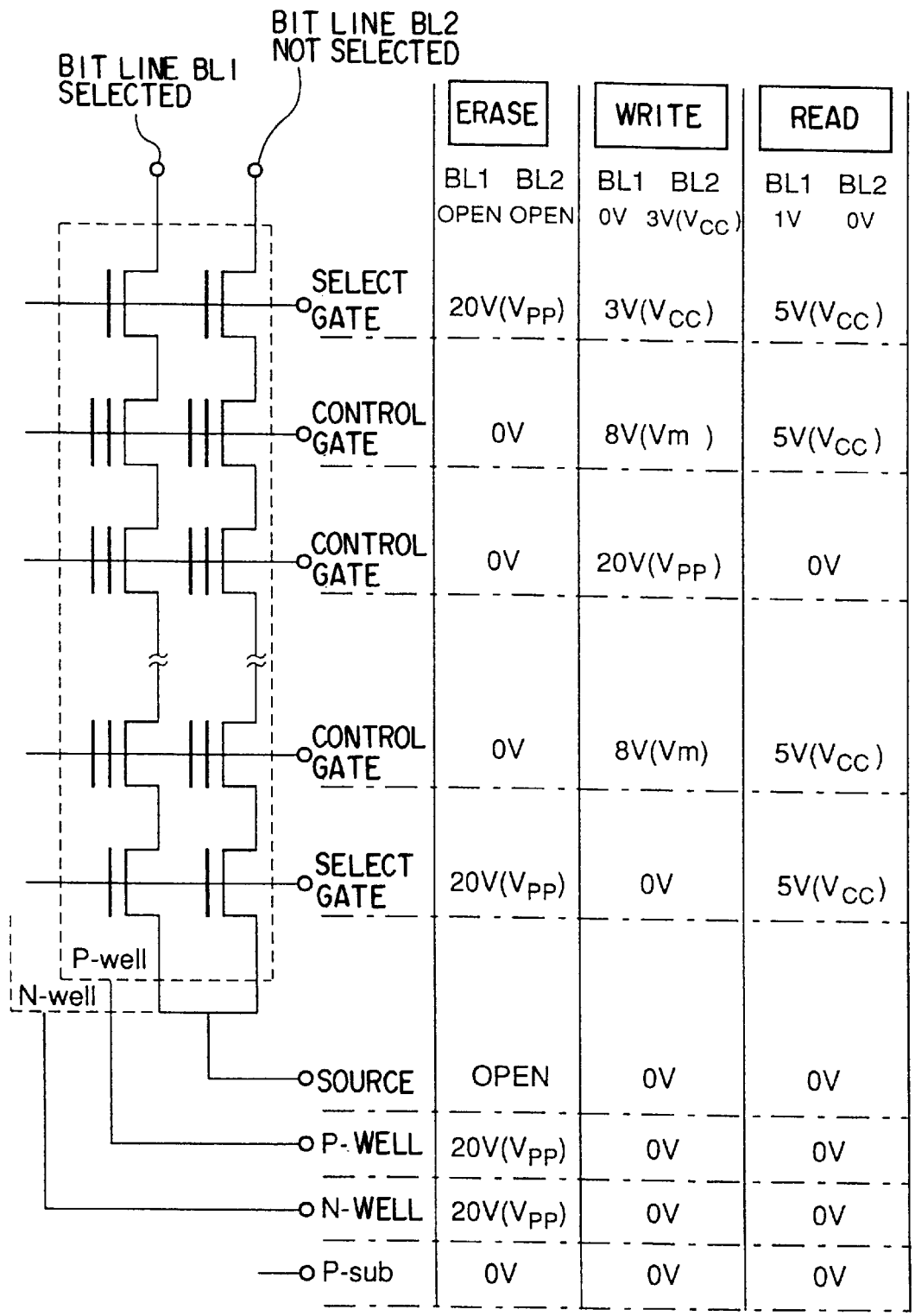
FIG. 9 shows an operating potential relationship of the memory cell array of the conventional NAND cell arrangement and shows a non-selected bit line floating type program.
Figure 10:
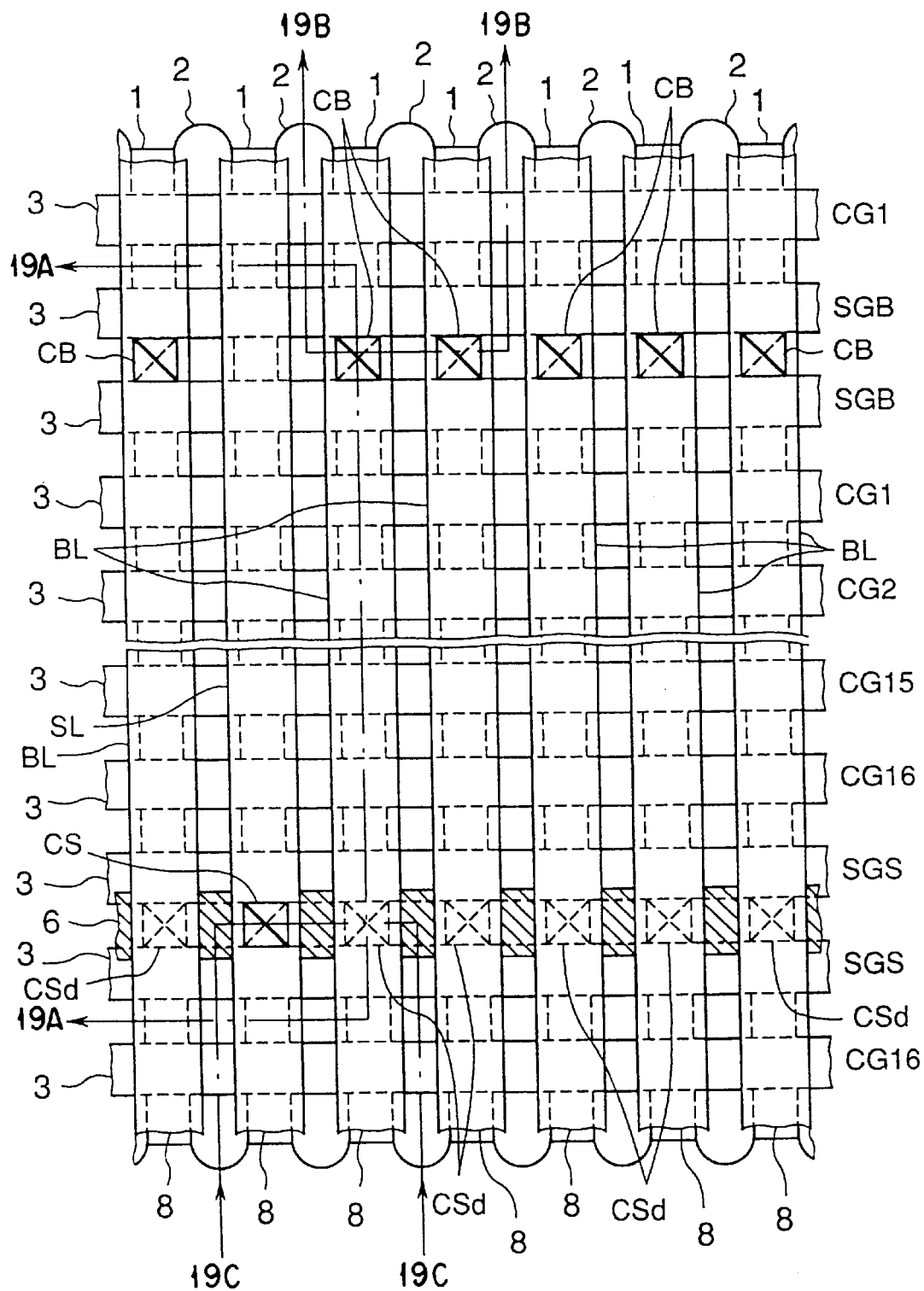
FIG. 10 is a plan view showing the partial arrangement of the memory cell array of a NAND type EEPROM according to a first embodiment of the present invention.
Figure 11:
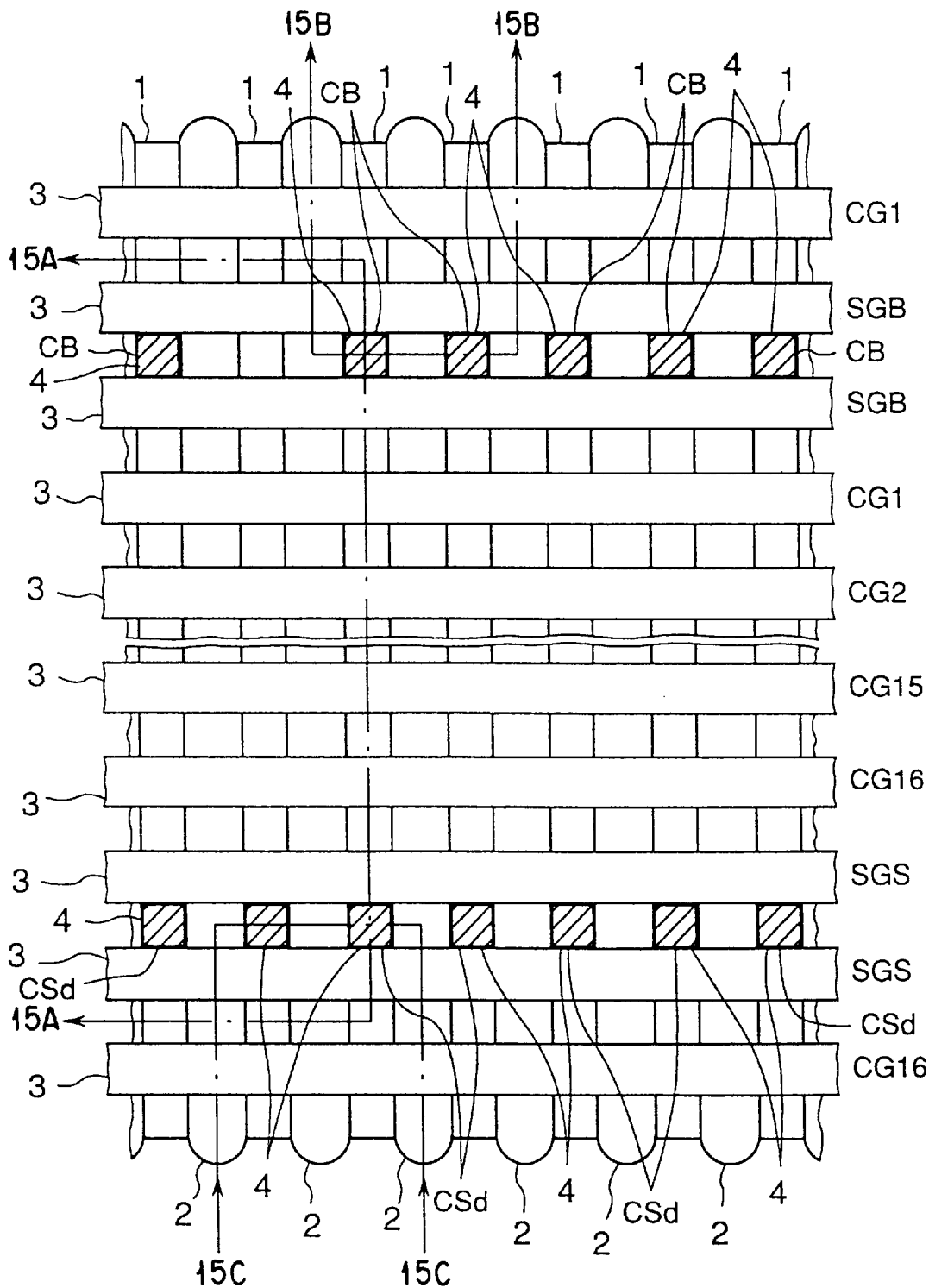
FIGS. 11 to 13 are plan views sequentially showing the process of manufacturing the memory cell array of the NAND type EEPROM shown in FIG. 10.
Figure 12:
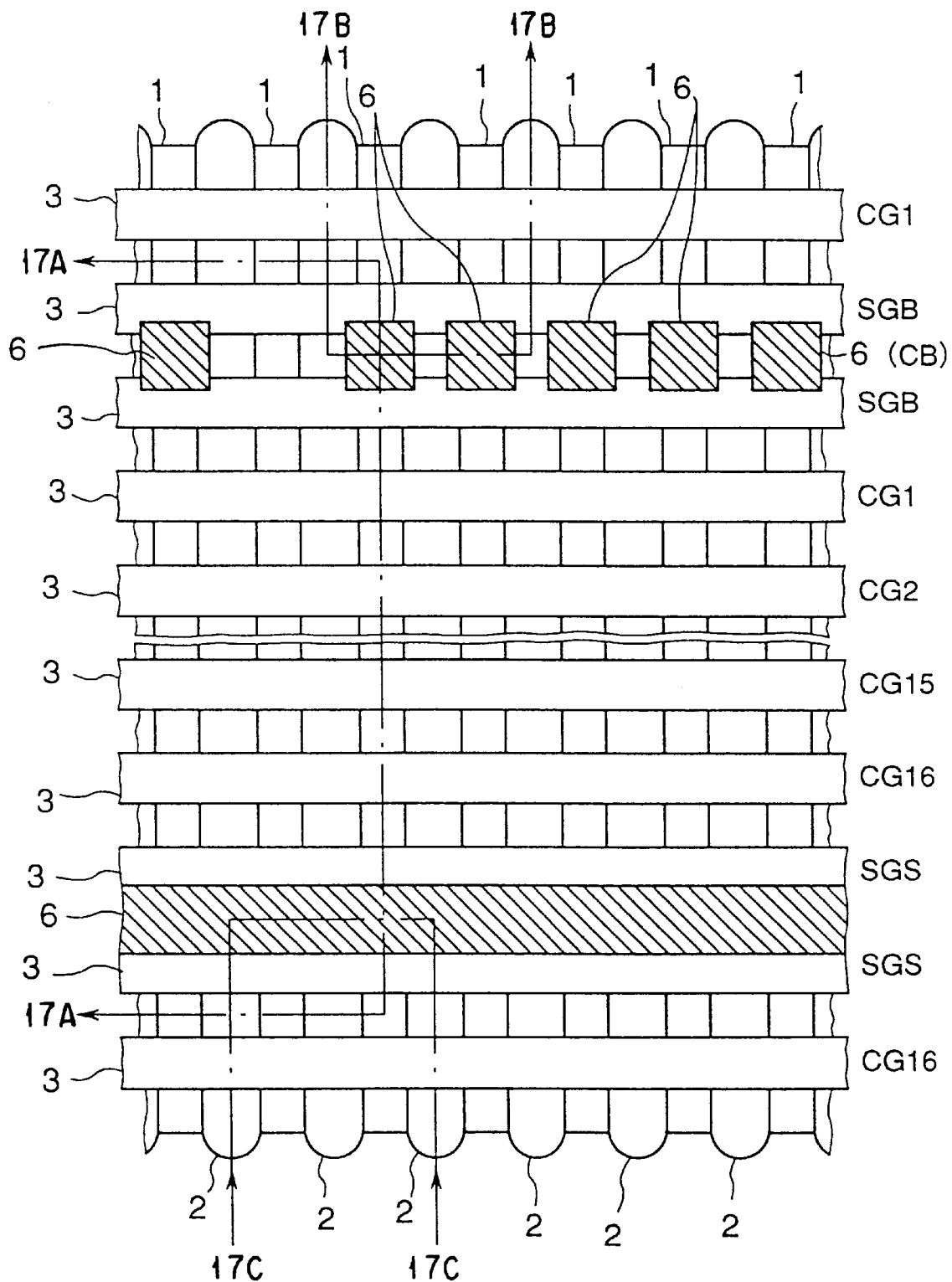
Figure 13:
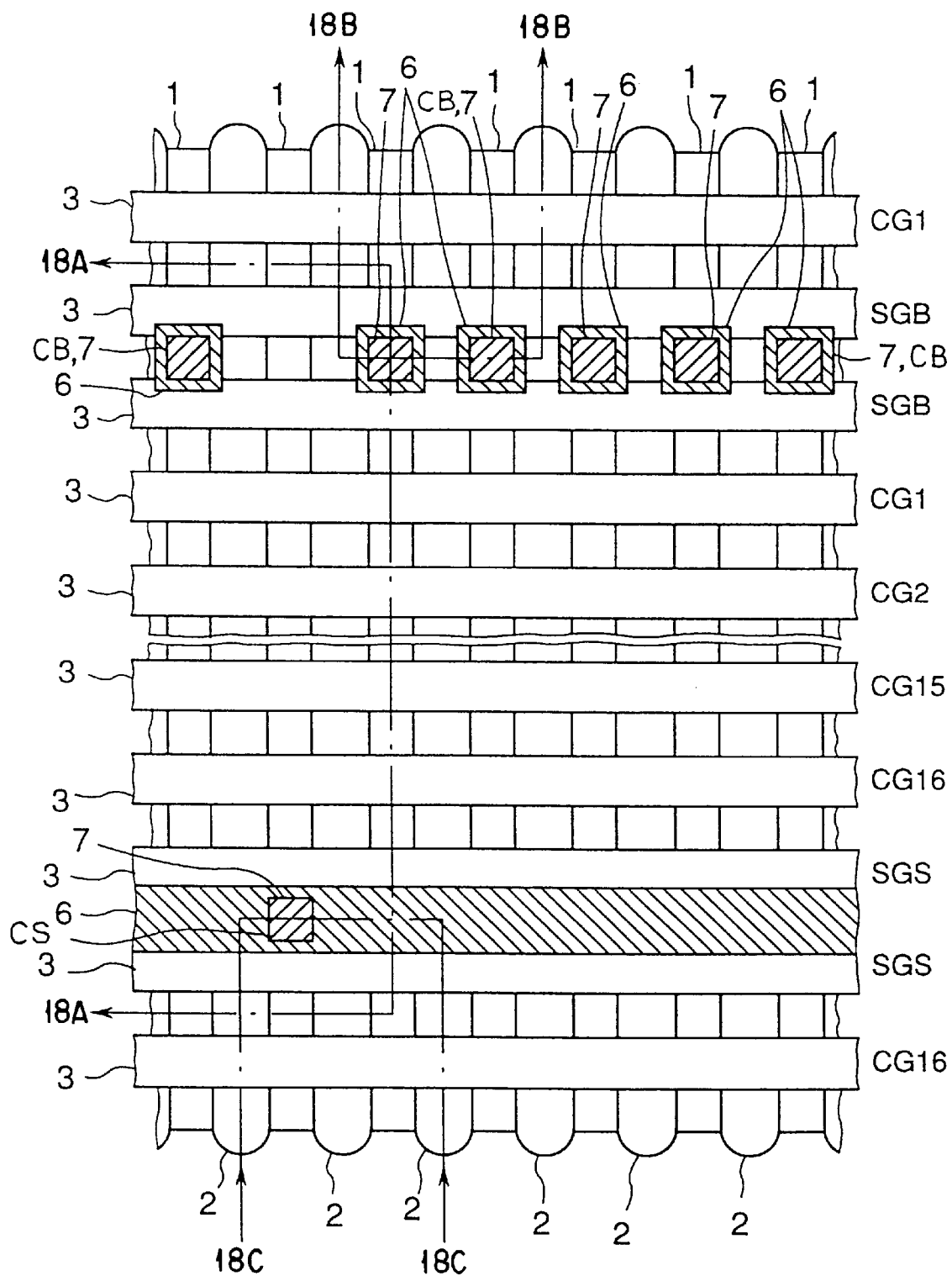

FIG. 10 is a plan view showing a partial arrangement of a memory cell array of a NAND type EEPROM according to a first embodiment of the present invention.

Referring to cross sectional views shown in FIGS. 19A to 19D, the partial arrangement of the memory cell array shown in FIG. 10 will be described.

Element regions (first semiconductor regions) 1 on a semiconductor substrate region are separated by element separating regions 2. The element regions 1 are arranged in a stripe-like form. In the element separating region 2, a trench (groove) is partially formed. An insulating member (for example, an oxide film) is buried in the trench. The element separating region 2 may be also a field insulating member (for example, the oxide film) in which a semiconductor substrate is partially oxidized. Source/drain regions are impurity diffusion layers (second semiconductor regions) having a conductive type oposite to the semiconductor substrate region. The source/drain region is doped with the impurity by a heat diffusion or an ion implantation so as to thereby be formed.

Stacked gates of memory cells cross the stripelike element regions 1 in order that the memory cells are arranged in matrix form. The gates are also disposed so that they may keep a predetermined space between each other.

In this stacked gate, a thin first gate insulating film 9 (tunnel oxide film) is formed on a channel region. A charge storage layer (floating gate) 10 is formed on this first gate insulating film 9. A gate electrode (control gate) 3 is also formed on the charge storage layer 10 through a second gate insulating film 11.

The first gate insulating film 9 (tunnel oxide film) has a thickness capable of sending/receiving a charge between the charge storage layer and the semiconductor substrate by a voltage applied between the gate electrode and the semiconductor substrate. For example, the first gate insulating film 9 is composed of an oxide film, a nitride film, an oxide nitride film or the like of 10 nm thick.

The charge storage layer is, for example, a polycrystalline silicon material, an amorphous silicon material or the like having high conductivity due to impurity doping. The second gate insulating film 11 is, for example, the oxide film, the nitride film, the oxide nitride film or a stacked film of the oxide film and the nitride film for electrically separating the charge storage layer 10 and the control gate 3 from each other. Such a stacked gate is covered with an insulating film (for example, the nitride film or the like) 25, whereby an interlaminar insulating film 26 is formed.

The gate electrode 3 on an upper portion of the stacked gate is arranged so that it may cross the stripe-like element region 1. That is, the gate electrode 3 constitutes select gates SGB, SGS of two select transistors and control gates CG1 through CG16 of a plurality of memory cells between the select transistors (one unit array).

A single bit line contact CB is shared with the above-described one unit array and another unit array on the select gate SGB side. The unit arrays are connected in parallel to each other. The one unit array is shared with another unit array and the source on the select gate SGS side. A metal interconnection 8 is disposed so that it may be arranged parallel to an upper layer of the element region 1. The metal interconnection 8 functions as a peripheral interconnecting member. In FIG. 10, the metal interconnection 8 is disposed as a bit line BL and a source line SL at intervals of plural bit lines BL.

In this embodiment, the source line SL is led to a source line contact portion through a metal member in the same manner that the bit line BL is led to a drain contact (bit line contact CB). In order to arrange source line contacts CS, CSd, first and third conductive members 4, 7 and a second conductive member 6 are used. The first and third conductive members are burying members for connecting a diffusion source region and the second conductive member and for connecting the second conductive member and the source line. The conductive members 4, 7 are, for example, the polycrystalline silicon material or the amorphous silicon material having high conductivity due to the impurity doping. The conductive member 6 is formed in order that the metal interconnection as the source line is connected to the contact portion at low resistance. The conductive member 6 is, for example, a high-melting-point metal material such as tungsten W or a low-resistance metal such as Al having resistivity lower than the resistivity of the conductive member 4.

Next, the following description is provided for a method of manufacturing the partial arrangement of the memory cell array shown in FIG. 10. In the first place, the description is provided with reference to FIGS. 11 and 15A to 15D.

The memory cell is formed in the following manner. That is, the charge storage layer 10 is formed on the tunnel oxide film 9 by doping a polycrystalline silicon or an amorphous silicon with an impurity. The insulating film (for example, an ONO film) to be the second gate insulating film 11 is formed on the charge storage layer 10. The gate electrode 3 (the polycrystalline silicon or the amorphous silicon) to be the control gate is formed on the insulating film 11. That is, the charge storage layer 10, the insulating film 11 and the gate electrode 3 are deposited in stacked layer form, whereby stack gate processing is performed so as to form the memory cell. The gate electrode 3 (control gate) may be formed by the use of a polyside on which Wsi, MoSi or the like is stacked in order to reduce the resistance.

The select gates SG (SGB, SGS) are formed by depositing, in stacked layer form, the charge storage layer 10, the insulating film 11 and the gate electrode 3 to be the select gate on the tunnel oxide film 9 or the insulating film thicker than the tunnel oxide film 9, for example, in the same manner as the memory cell. In this case, it is necessary to electrically connect each of the charge storage layers 10 arranged in a direction of the control gate. More specifically, the gate electrode 3 may be removed in order to come into direct contact with the charge storage layer 10. Alternatively, the charge storage layer 10 and the select gate may be shunted. Furthermore, the insulating film 11 may be removed in part or in whole.

Figure 14A:
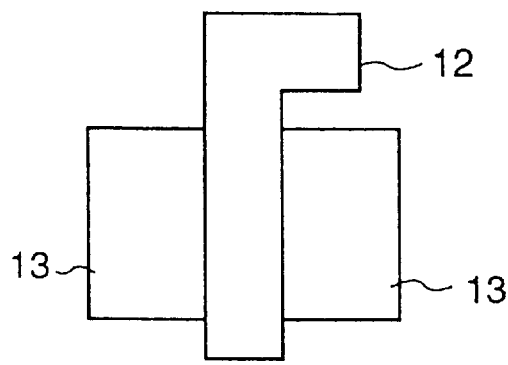
FIGS. 14A to 14E are plan views sequentially showing the process of manufacturing a peripheral transistor (MOS transistor) circuit formed together with the manufacturing process of the arrangement shown in FIG. 10.
Figure 14D:
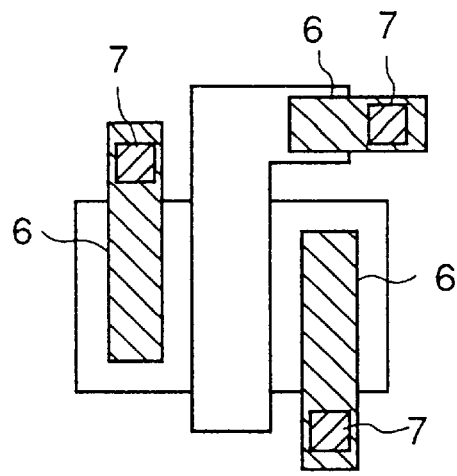

As shown in FIG. 14A, a peripheral transistor is formed by forming a gate electrode 12 on the gate insulating film.

The gate electrode 12 may be formed by the use of the member of the charge storage layer 10 of the memory cell. Alternatively, the member of the charge storage layer 10 may be removed so that the gate electrode 3 is directly arranged thereon. More alternatively, the charge storage layer 10 and the gate electrode 3 may be arranged in stacked layer form and may be then shunted in the same manner as the select gate. Moreover, as shown in FIG. 19D, the gate electrode 12 of the peripheral transistor may be covered with an insulating film 29 which is different from the interlaminar insulating film 26 in the same manner as the stacked gate.

The memory cell, the select gate transistor and the peripheral transistor are formed in the element region 1 in which the element is separated by the element separating region 2. The trench (groove) is partially formed in the element separating region 2. The insulating member (for example, the oxide film) is buried in the trench. Alternatively, the element separating region 2 may be the field insulating member (for example, the oxide film) in which the semiconductor substrate is partially oxidized.

After the gate processing, a source and drain portion of each transistor element is doped with an N-type impurity or a P-type impurity. A diffusion layer 13 of an N-channel MOS transistor or a P-channel MOS transistor is thus formed (FIGS. 14A and 15D). The diffusion layer 13 of the memory cell is also formed in the same manner.

In this embodiment, adopted is a self aligned contact for arranging the bit line contact and the source line contact in a self-matching manner with respect to the select gate. That is, for example, a silicon nitride film is deposited on the select gates SG (SGB, SGS). A silicon nitride material is then used as a mask, whereby the stack gate processing is performed. The silicon nitride is again deposited. An etching is performed so that the silicon nitride may remain on a side wall of a gate material, whereby the stacked gate is covered with the silicon nitride material so as to form the insulating film 25.

The interlaminar insulating film 26 is composed of, for example, SiO$_2$ and BPSG. If necessary, the interlaminar insulating film 26 is flattened by RIE and CMP methods. The bit line contact (CB) and the source line contact (CSd) on the diffusion layer side are then etched by means of the RIE method so as to form an opening. At this time, the etching is performed between the interlaminar insulating film 26 and the insulating film 25 under a gas condition capable of obtaining a higher selectivity ratio. In this case, when an interlaminar insulating material is etched, since the stacked gate, more specifically, the gate electrode 3 is masked with the silicon nitride, the interlaminar insulating film 26 alone in the contact portion is etched. Therefore, even if there is not provided an allowance for avoiding a misalignment or the like of the gate and the contact, the contact can be formed without etching the stacked gate.

The use of the self aligned contact allows the alignment allowance to be eliminated. A reduction of memory size can be thus accomplished. However, if the allowance is provided, the self aligned contact is not required.

In such an opened bit line contact (CB) and a source line contact (CSd) on the diffusion layer side, the conductive member 4 is formed so as to be electrically connected to each impurity diffusion layer (FIGS. 15A to 15D). The conductive member 4 is formed by, for example, burying the N-type doped polycrystalline silicon or amorphous silicon therein and by performing the CMP (Chemical Mechanical Polishing) method.

A material to be buried in the conductive member 4 may not be a silicon material. For example, the buried material may be a metal material such as tungsten W. In case of a metal material such as tungsten W, it is necessary to previously form a barrier metal material such as Ti/TiN in the contact. If the alignment allowance is not provided between the element region 1 on the semiconductor substrate and the contact CB or CSd, as shown in FIGS. 15A to 15D, the contact region is deviated into the element separating region 2. There is a possibility that the barrier metal or the metal material is not uniformly formed in a pivot portion due to the above-mentioned deviation. Thus, a contact failure or the like is possibly caused.

On the other hand, when the silicon material is buried as the conductive member 4 shown in this embodiment, the silicon of the same material as the substrate is also buried into the bivot portion. Thus, the contact failure is not caused. A misalignment allowance can be therefore eliminated in a direction of element separation.

Figure 14B:
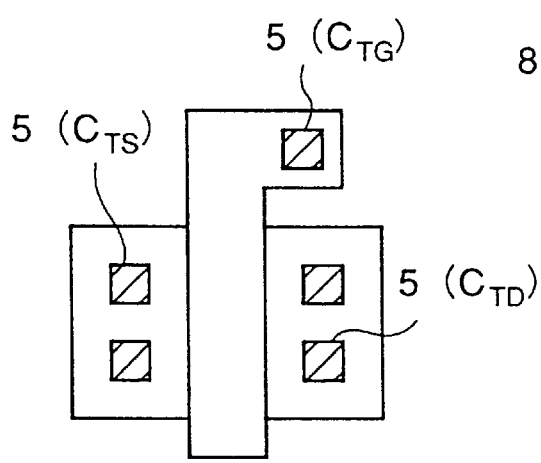
Figure 14E:
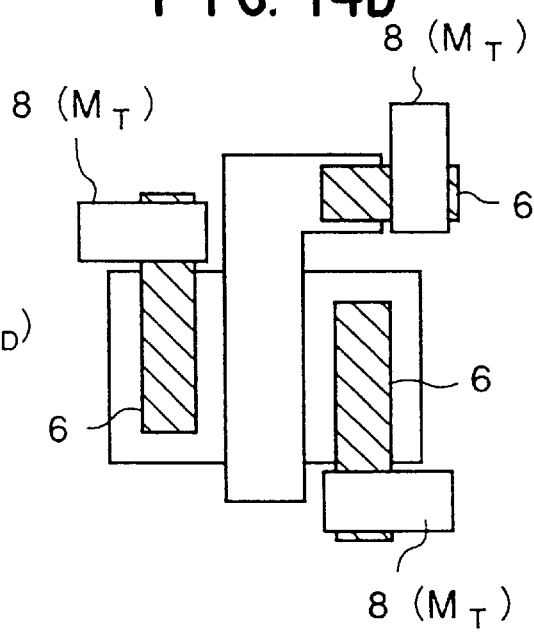
Figure 14C:
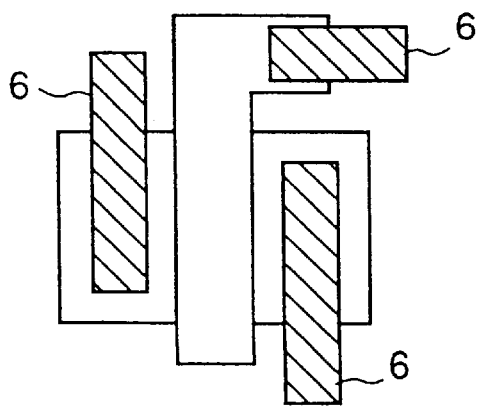

Next, in the peripheral transistor, as shown in FIGS. 14B and 16D, a conductive member 5 is formed in a source contact $C_{TS}$, a drain contact $C_{TD}$ and a gate contact $C_{TG}$. For example, the high-melting-point metal material such as tungsten W or the low-resistance metal material such as Al is suitable for the conductive member 5. A well contact in the memory cell array can be also formed by the same method.

Next, as shown in FIGS. 12, 14C and 17A to 17D, conductive members 6 to be drawing electrodes are formed on the bit line contact CB, the source line contact CSd on the diffusion layer side and the contacts $C_{TS}$, $C_{TD}$ and $C_{TG}$ of the peripheral transistor, respectively. At this time, the conductive member 6 on the source line contact CSd on the diffusion layer side is formed between the select gates so that it may be arranged along a select gate SGS in order that it is connected to each of the conductive members 4 arranged in the direction of the control gate.

A formation of this conductive member 6 may be accomplished by, for example, patterning after a deposition of tungsten W. Alternatively, this formation may be also accomplished by once depositing the insulating film, removing the insulating film in an interconnection portion to a depth corresponding to a height of the interconnection, burying the conductive member 6 and flattening by means of the CMP method.

The conductive member 6 and the conductive member 5, that is, the contact to be buried in the peripheral transistor are composed of the same material such as tungsten W. In this case, after the contacts ($C_{TS'}$, $C_{TD'}$ and $C_{TG'}$) are opened, a burying is not performed. As described above, an interlaminar insulating member in the interconnection portion is removed to the depth corresponding to the height of interconnection and the conductive member 6 is then buried, whereby one burying process and one flattening process each can be eliminated.

Next, as shown in FIGS. 13, 14D and 18A to 18D, the contacts (CS, CB) are selectively opened on the conductive member 6. The conductive member 7 is then formed in the openings. The conductive member 7 is the buried member for electrically connecting to the metal interconnections, that is, the bit line and the source line and other metal interconnections. For example, the tungsten W or Al is buried, whereby the conductive member 7 is flattened.

As shown in FIGS. 10, 14E and 19A to 19D, the metal interconnection 8 is then patterned as a peripheral interconnection material. As described above, the metal interconnection 8 is composed of a low-resistance interconnection material such as Al. A bit line BL, a source line SL and a peripheral interconnection ($M_T$) are formed by the metal interconnection 8.

According to the memory cell array of the first embodiment, the diffusion source regions are bonded to each other by the buried contact (conductive member 4) and a metal conductive material (conductive member 6) coupled to the conductive member 4. The diffusion source region is connected to the source line (SL) of the metal interconnection by the conductive member 7. As a result, the etching of the element separating film such as the SAS method is not required. Moreover, since the resistance between the diffusion source regions mainly depends on the resistance of the metal conductive material, the resistance can be greatly reduced between the diffusion source regions.

Furthermore, the bit line and the source line are formed so that they may extend in the same direction. An interconnecting layout associated with a connection to a peripheral circuit is therefore facilitated. Thus, the memory cell array can be more finely formed.

Furthermore, it is possible to form a connection structure for the bit line and the source line in the same process and at the same time. This is advantageous to a simplification of manufacturing process and an improvement of process yield. When the memory cell array and the peripheral circuit are formed on the same semiconductor substrate, it is also possible to form, in the same process and at the same time, the connection structure for a signal line in the memory cell such as the bit line (data line) and the source line and a signal line connected to at least one of the source, the drain and the gate of the transistor in the peripheral circuit. This is also advantageous to the simplification of the manufacturing process and the improvement of process yield.

FIG. 20 shows the bit line contact CB as a partial application example for the fine formation. Below described is a positional relationship between the conductive member 6 which is the drawing electrode shown in FIG. 10 and the conductive member 7 to be the buried contact. That is, the conductive members 6 and 7 are alternately shifted and drawn out in a direction of the bit line, whereby they are positioned so that the positions of the adjacent contact portions may not be adjacent to each other. For the formation of the memory cell, it is thus unnecessary to consider a formation allowance of the conductive member 6 as the drawing electrode associated with the adjacent bit line contacts. Therefore, this contributes to further fine formation.

Figure 21:
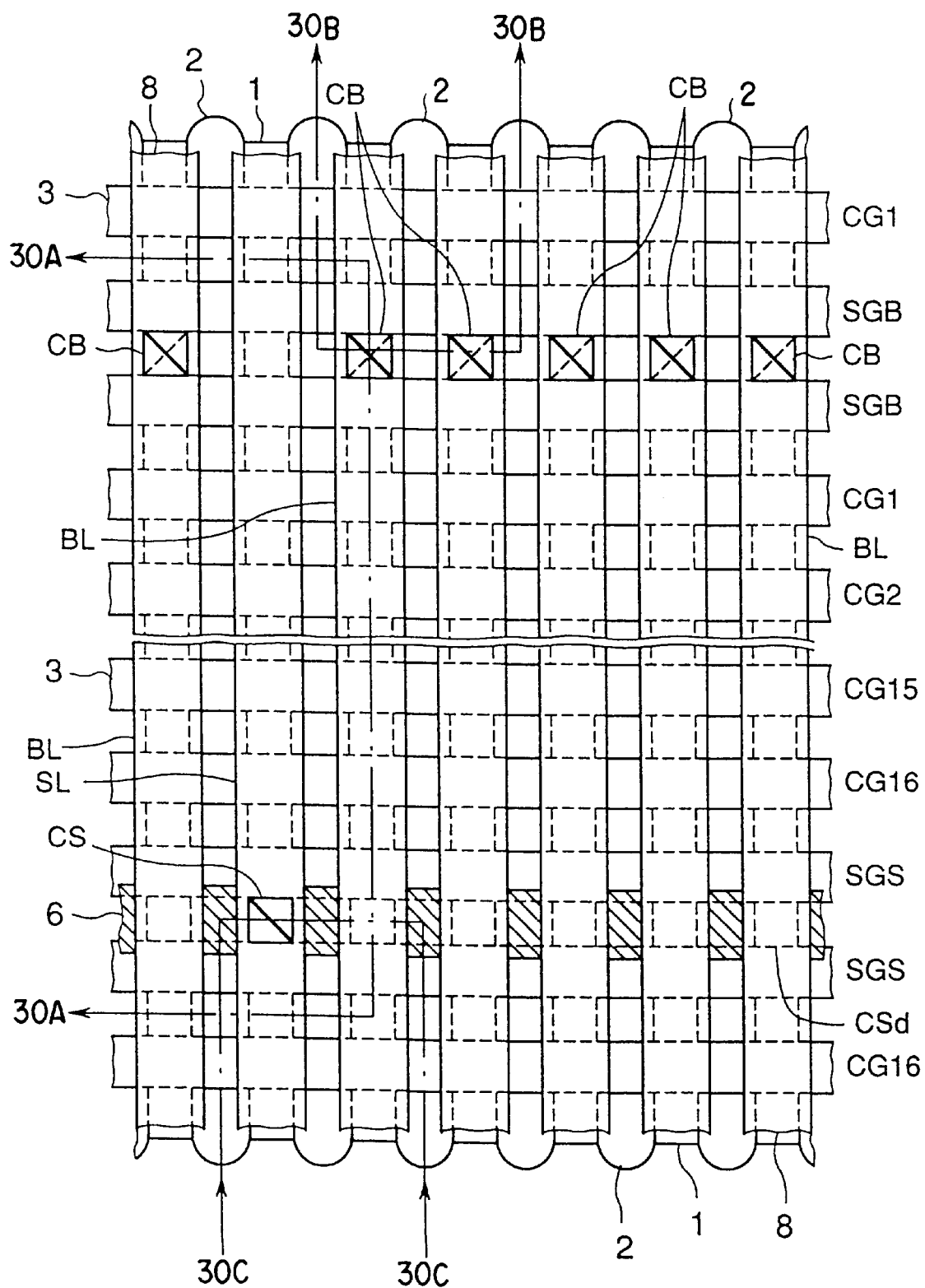
FIG. 21 is a plan view showing the partial arrangement of the memory cell array of the NAND type EEPROM according to a second embodiment of the present invention.

FIG. 21 is a plan view showing the partial arrangement of the memory cell array of a NAND type EEPROM according to a second embodiment of the present invention.

Figure 22:
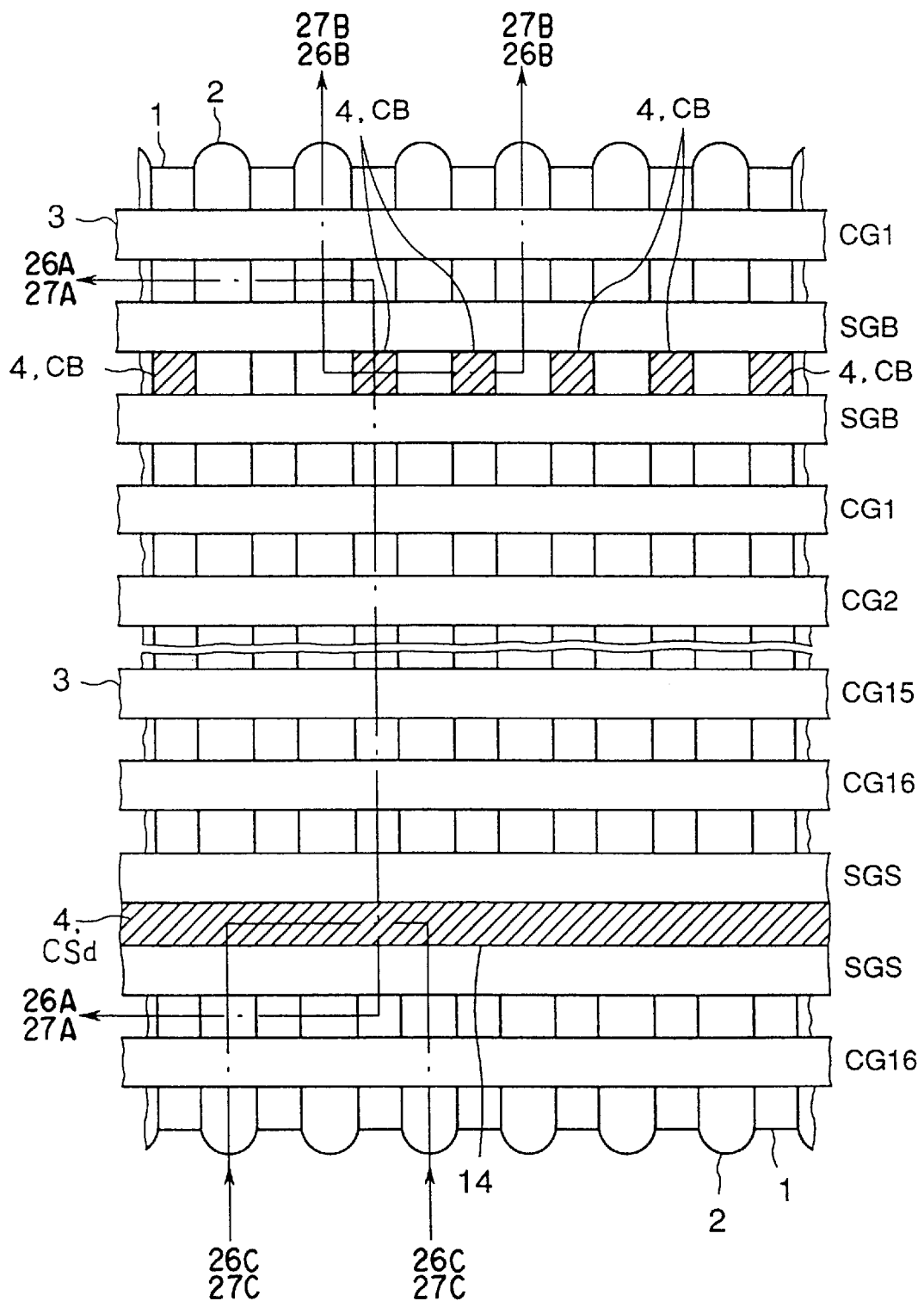
FIGS. 22 to 24 are plan views sequentially showing the process of manufacturing the partial arrangement of the memory cell array shown in FIG. 21.
Figure 23:
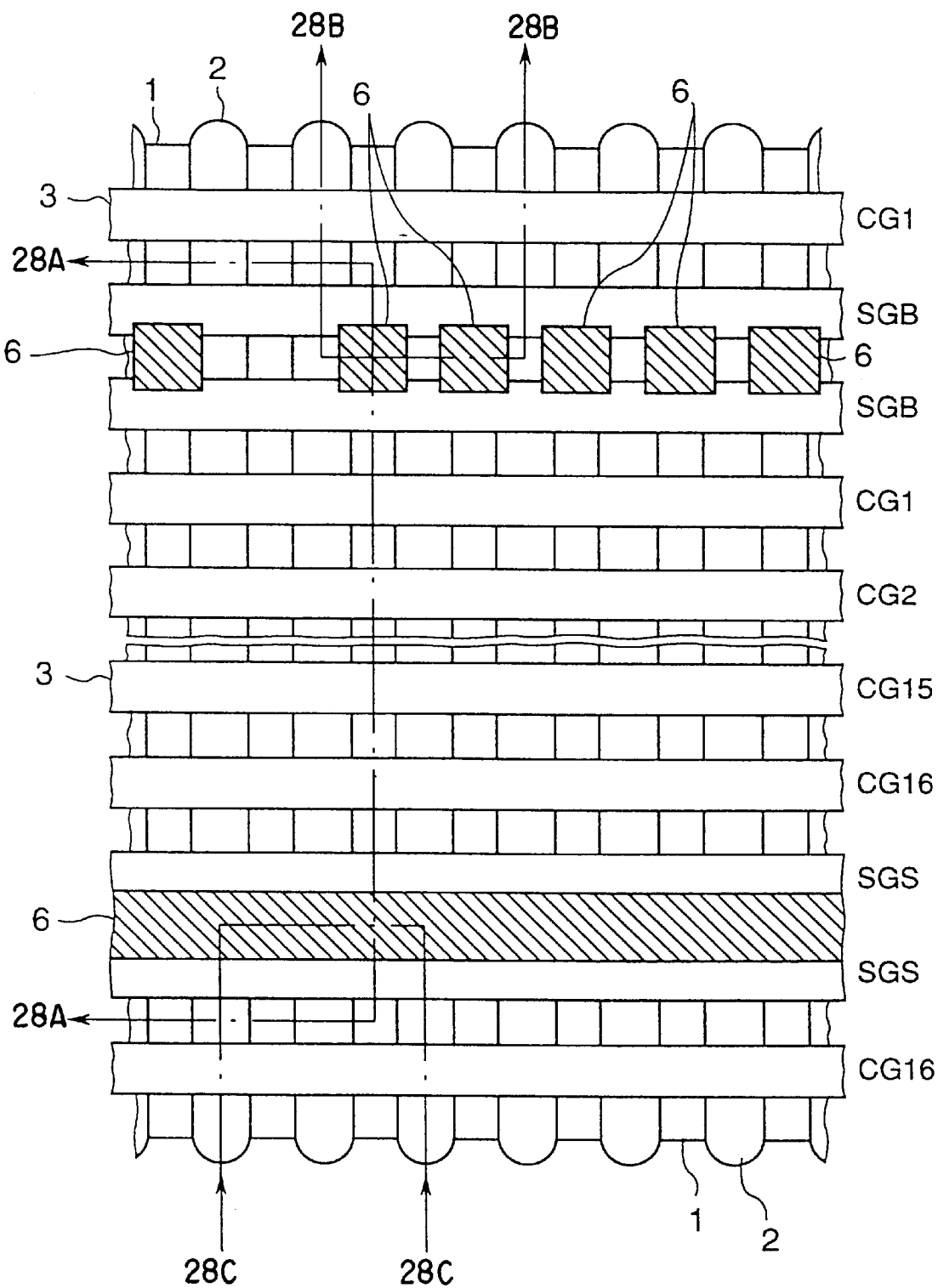
Figure 24:
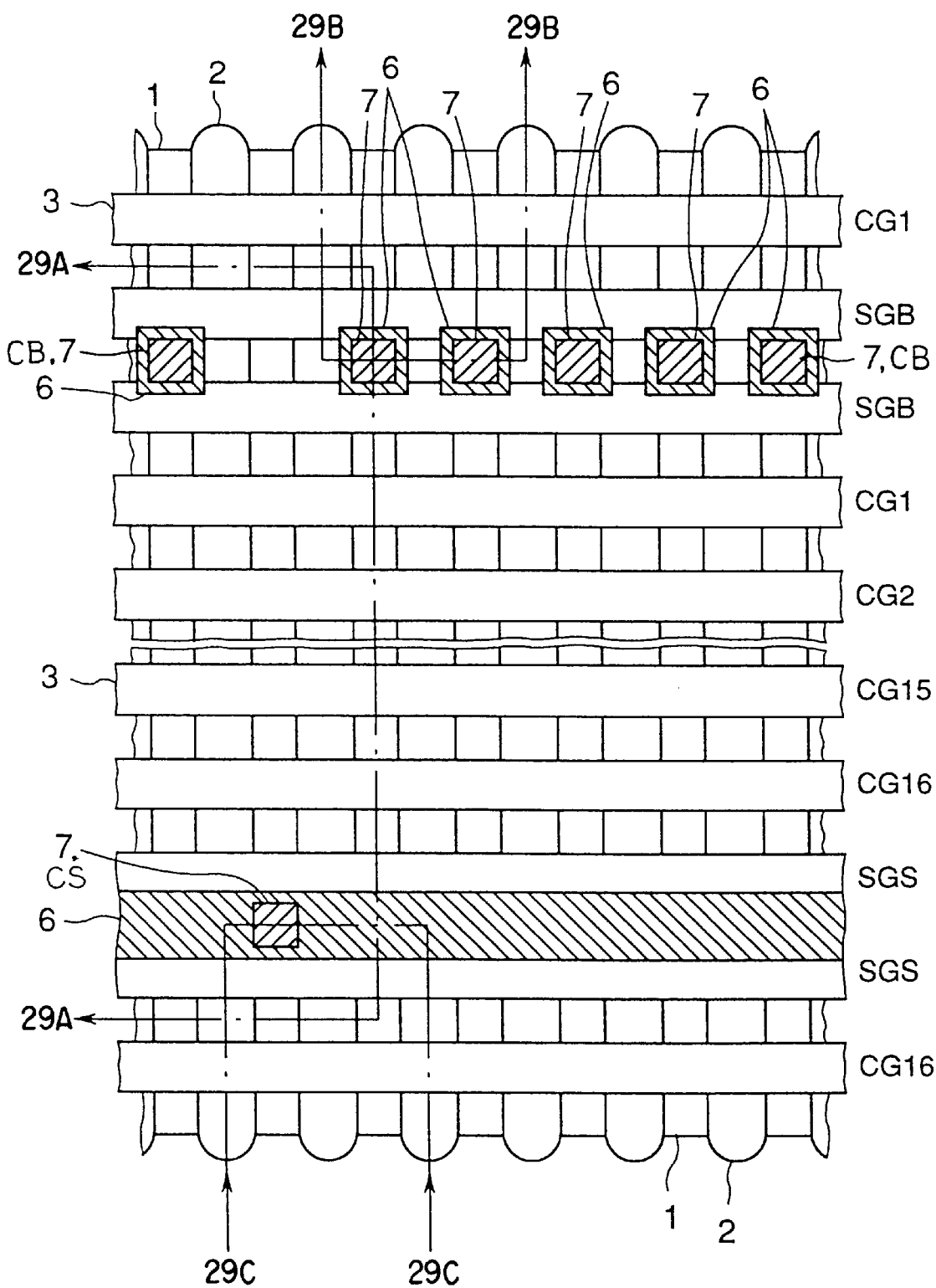

FIGS. 22 to 24 are plan views sequentially showing the process of manufacturing the partial arrangement of the memory cell array shown in FIG. 21.

FIGS. 25A to 25E are plan views sequentially showing the process of manufacturing the peripheral transistor (MOS transistor) circuit formed together with the process of manufacturing the arrangement of FIG. 21.

FIGS. 26A to 26C, 27A to 27C, 28A to 28C, 29A to 29C and 30A to 30C are cross sectional views sequentially showing the process of manufacturing the partial arrangement of the memory cell array shown in FIG. 22, respectively. FIGS. 26D, 27D, 28D, 29D and 30D are cross sectional views of the partial arrangement of the memory cell array corresponding to the manufacturing process shown in FIGS. 25A to 25E, respectively.

Referring to FIGS. 30A to 30D, a difference in the arrangement between the first embodiment shown in FIG. 10 and the second embodiment is mainly described with reference to the arrangement shown in FIG. 21.

Although the diffusion source region is led to the source line through the conductive member in the same manner as the first embodiment, the contact structure of the first conductive member 4 is different. In the conductive member 4, although the bit line contact CB of the second embodiment is the same as that of the first embodiment, the source line contact CSd on the diffusion layer side is different.

That is, an opening 14 is formed along the region located between the select gates SGS on the source side. The conductive member 4 is buried (FIG. 30C). Other arrangements of the memory cell (Cell), the select gate (SGS), the peripheral transistor (FIGS. 25A to 25E), the metal interconnection 8 of the bit line and the source line or the like are the same as the first embodiment.

That is, in the second embodiment, as shown in FIG. 30C, the conductive member 4 is also arranged on the element separating region 2. Accordingly, the resistance between the diffusion source regions is substantially a parallel resistance of the conductive member 6 as the drawing electrode and the conductive member 4. The lower the resistance of the conductive member 4 is, the more the resistance can be reduced.

As shown in FIG. 22, the conductive members 4 are continuously formed so that they may be connected to many diffusion source regions in the direction of the control gate. However, the conductive members 4 may not always be continuously formed along the region located between the select gates SGS. For example, even if a plurality of conductive members 4 are discontinuously formed, the length of the conductive member 4 in the direction of the control gate is about three times or more longer than a diameter of the bit line contact CB. In this case, a plurality of diffusion source regions can be continuously connected by a single conductive member 4, whereby the resistance between the diffusion source regions can be reduced.

The method of manufacturing the arrangement of FIG. 21, mainly, the difference between the first and second embodiments will be described below.

In the first place, reference is made to FIGS. 22 and 26A to 26D. In the same manner as FIG. 11, the bit line contact CB is formed. In this embodiment, the opening 14 corresponding to the diffusion source region (the source line contact CSd on the diffusion layer side) is also formed. Next, the conductive member 4 is buried in the bit line contact CB and the opening 14. The conductive member 4 is formed by, for example, burying the N-type doped polycrystalline silicon or amorphous silicon therein and by performing the CMP (Chemical Mechanical Polishing) method.

Figure 25A:
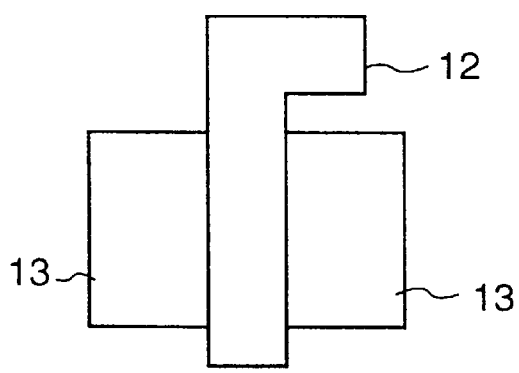
FIGS. 25A to 25E are plan views sequentially showing the process of manufacturing the peripheral transistor (MOS transistor) circuit formed together with the process of manufacturing the partial arrangement of the memory cell array shown in FIG. 21.
Figure 25B:
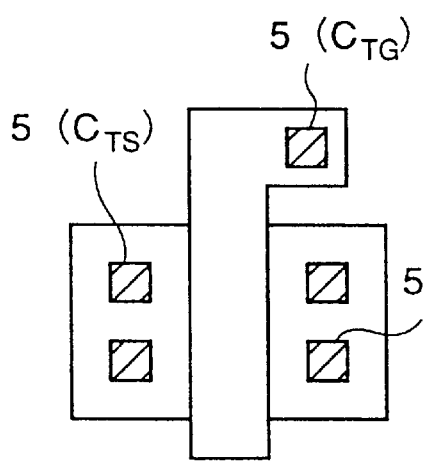
Figure 25C:
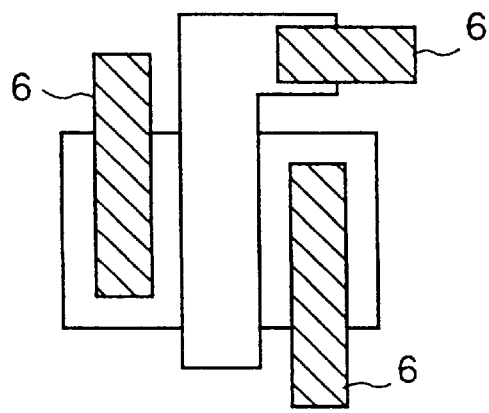
Figure 25D:
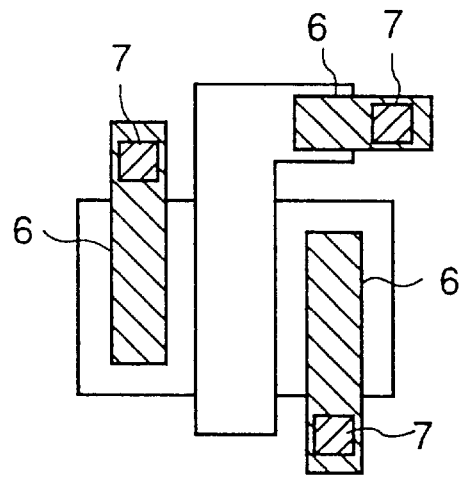
Figure 25E:
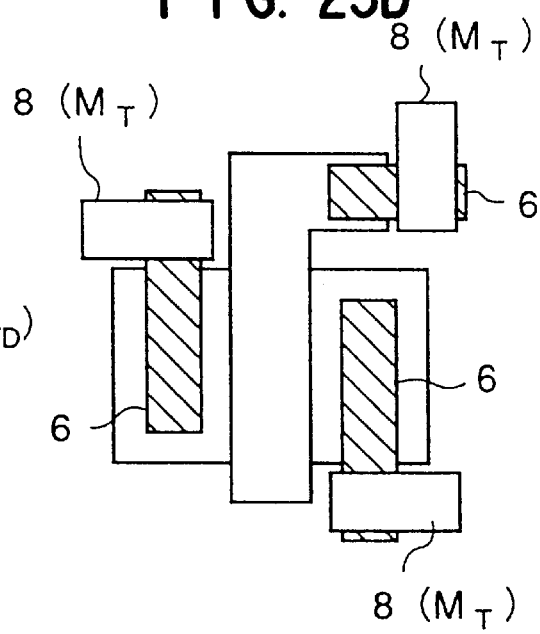

Next, in the peripheral transistor, as shown in FIGS. 25B and 27D, the conductive member 5 is formed in the source contact ($C_{TS}$), the drain contact ($C_{TD}$) and the gate contact ($C_{TG}$) (as is the case with the first embodiment).

Next, as shown in FIGS. 23, 25C and 28A to 28D, the conductive members 6 to be the electrodes are formed on the conductive member 4 in the bit line contact CB and the source line contact CSd on the diffusion layer side and on the contacts $C_{TS}$, $C_{TD}$ and $C_{TG}$ of the peripheral transistor, respectively. This process is also the same as the first embodiment. The conductive member 6 is formed between the select gates so that it may be arranged along the select gate SGS.

Next, as shown in FIGS. 24, 25D and 29A to 29D, the contacts CS, CB are selectively opened on the conductive member 6. The conductive member 7 is then formed in the openings. This process is also the same as the first embodiment.

As shown in FIGS. 21, 25E and 30A to 30D, the metal interconnection 8 is then patterned as the peripheral interconnection material. As described above, the metal interconnection 8 is composed of a low-resistance interconnection material such as Al. The bit line BL, the source line SL and the peripheral interconnection ($M_T$) are formed by the metal interconnection 8.

According to the method of this embodiment, the conductive member 4 is continuously buried between the select gates SGS. Thus, the conductive member 4 can be formed so that the resistance may be easily reduced. The further reduction of the resistance between the diffusion source regions can be therefore expected.

Figure 31:
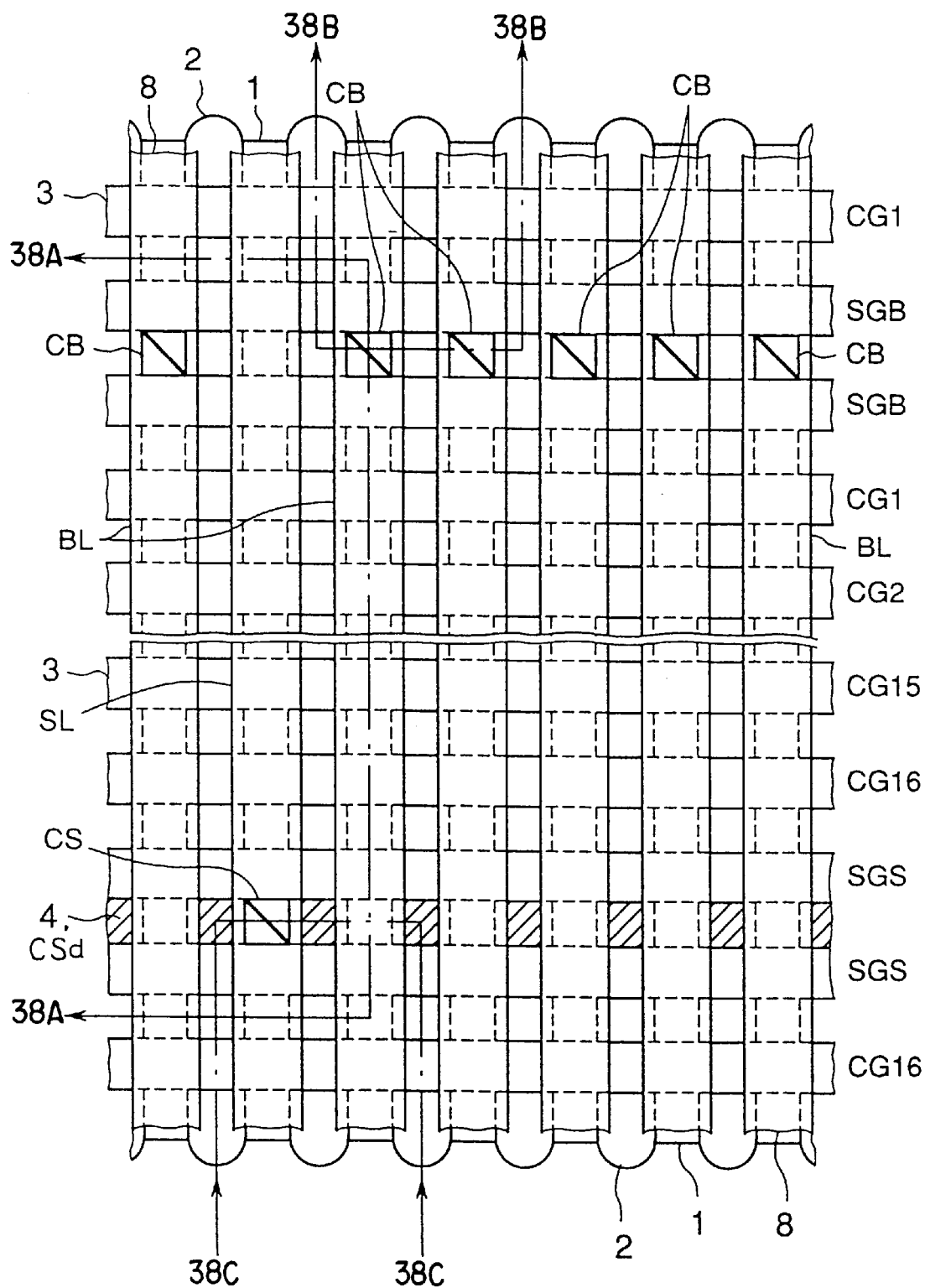
FIG. 31 is a plan view showing the partial arrangement of the memory cell array of the NAND type EEPROM according to a third embodiment of the present invention.
Figure 32:
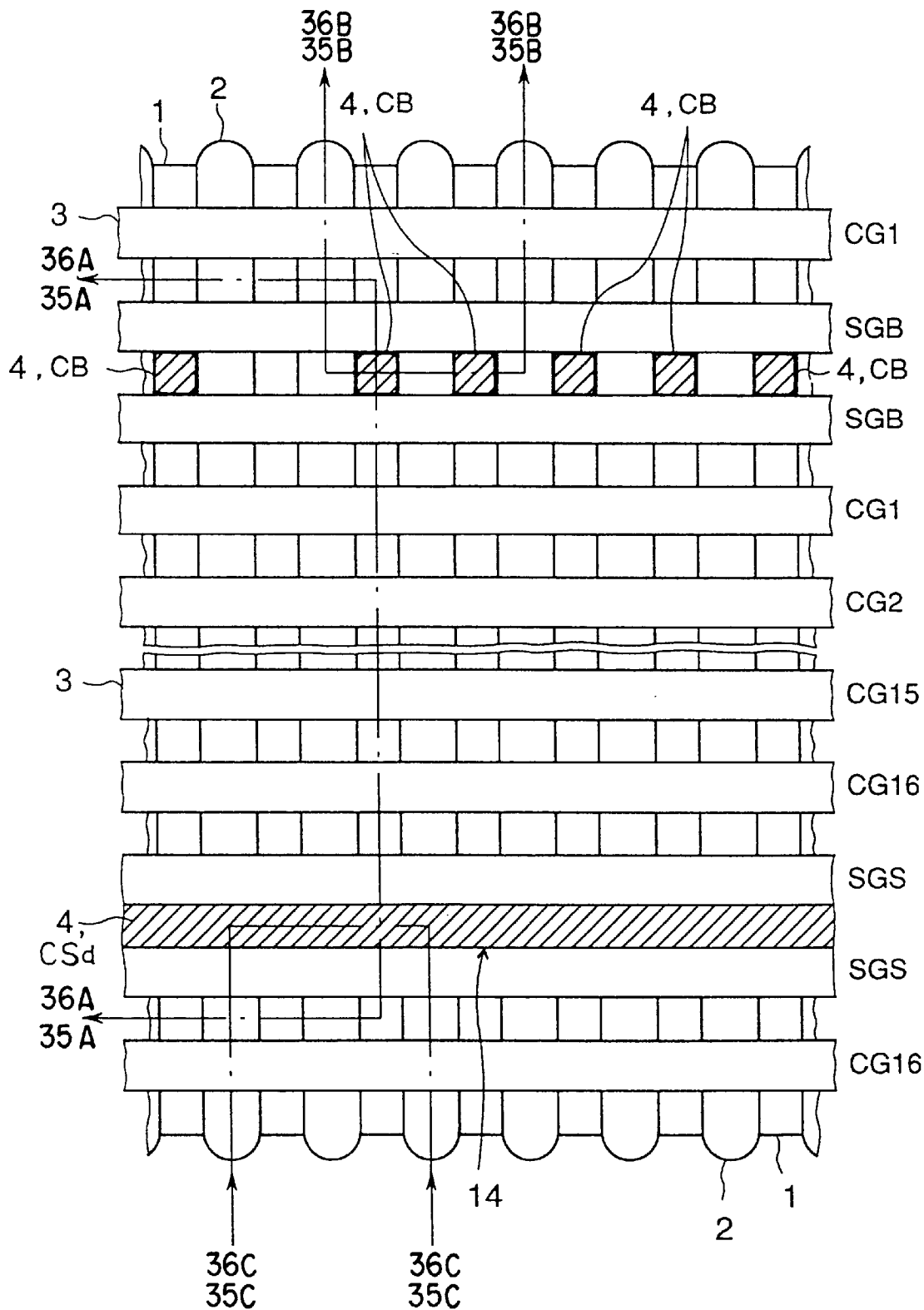
FIG. 32 is a plan view showing the process of manufacturing the partial arrangement of the memory cell array shown in FIG. 31.
Figure 33:
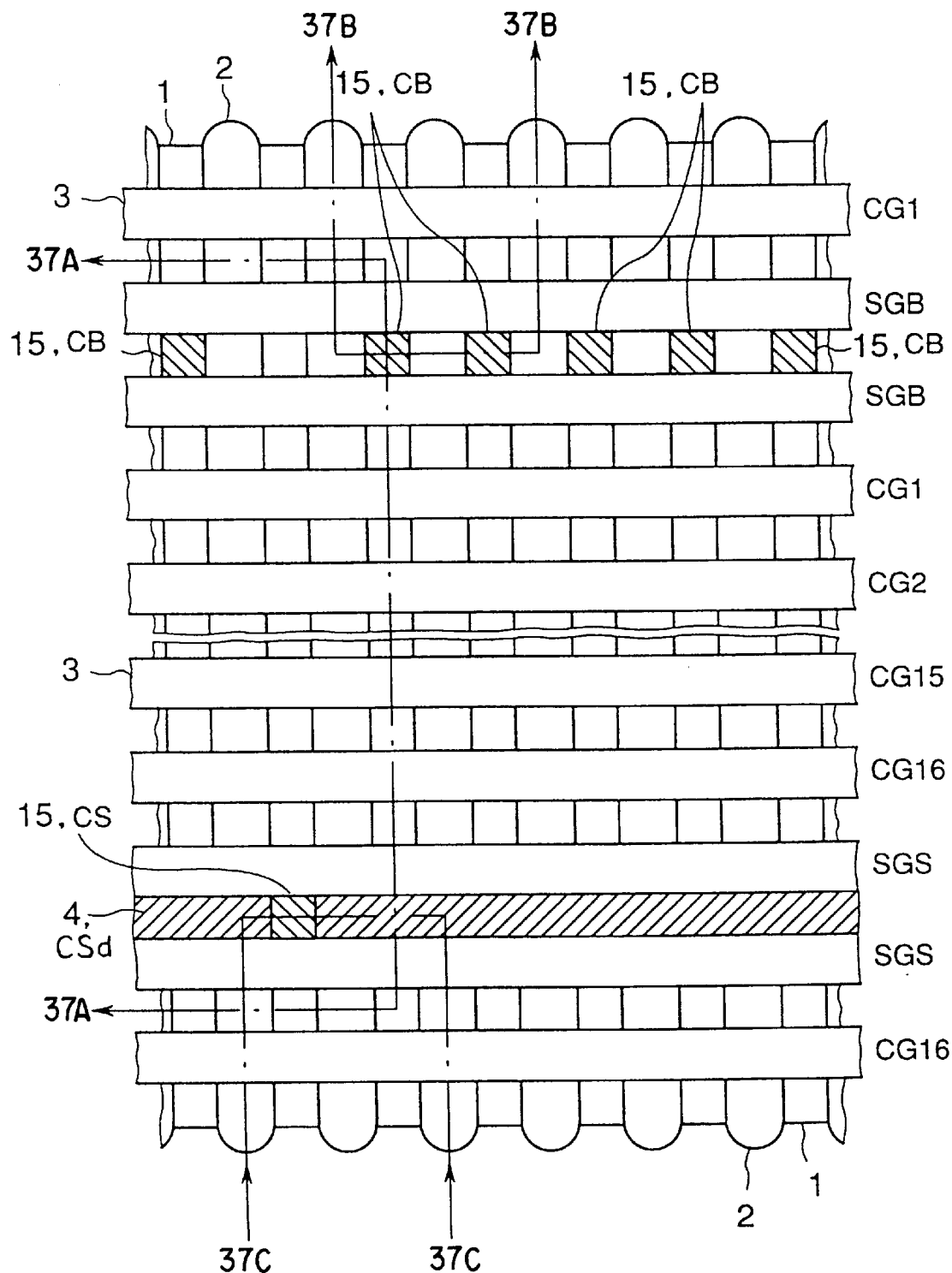
FIG. 33 shows the manufacturing process following the process shown in FIG. 32.

FIG. 31 is a plan view showing the partial arrangement of the memory cell array of the NAND type EEPROM according to a third embodiment of the present invention. FIGS. 32 and 33 are plan views sequentially showing the process of manufacturing the arrangement of FIG. 31. FIGS. 34A to 34D are plan views sequentially showing the process of manufacturing the peripheral transistor (MOS transistor) circuit formed together with the process of manufacturing the partial arrangement of the memory cell array shown in FIG. 31.

FIGS. 35A to 35C, 36A to 36C, 37A to 37C and 38A to 38C are cross sectional views sequentially showing the process of manufacturing the arrangement shown in FIG. 31, respectively, and correspond to the cross sectional views taken on lines of figure numbers shown in FIGS. 31 to 33.

FIGS. 35D, 36D, 37D and 38D are cross sectional views of the part corresponding to the manufacturing process shown in FIGS. 34A to 34D, respectively.

Referring to FIGS. 38A to 38D, the difference in the arrangement between the third embodiment and the second embodiment shown in FIG. 21 is mainly described with reference to the arrangement shown in FIG. 31.

Although the diffusion source regions are continuously bonded to each other by the first conductive member 4 in the same manner as the second embodiment, the conductive member 6 is not disposed over the conductive member 4. A conductive member 15 is located directly on the conductive member 4. The bit line contact CB and the source line contact CS are buried by the conductive member 15. Thus, the interconnecting arrangement of the peripheral transistor is different as shown in FIGS. 34A to 34D. Other arrangements of the memory cell (Cell), the select gate (SGS), the metal interconnection 8 of the bit line and the source line or the like are the same as the second embodiment.

The method of manufacturing the arrangement of FIG. 31, mainly, the difference between the second and third embodiments will be described below.

In the first place, reference is made to FIGS. 32 and 35A to 35D. In the same manner as FIG. 22, the bit line contact (CB) is formed. The opening 14 corresponding to the diffusion source region (the source line contact CSd on the diffusion layer side) is also formed. Next, the conductive member 4 is buried in the bit line contact CB and the opening 14. The conductive member 4 is formed by, for example, burying the N-type doped polycrystalline silicon or amorphous silicon therein and by performing the CMP (Chemical Mechanical Polishing) method.

Figure 34A:
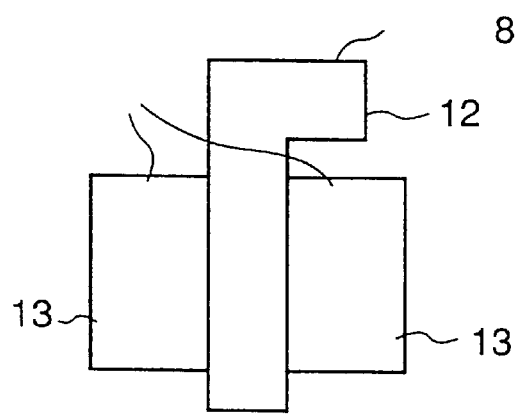
FIGS. 34A to 34D are plan views sequentially showing the process of manufacturing the peripheral transistor (MOS transistor) circuit formed together with the process of manufacturing the partial arrangement of the memory cell array shown in FIG. 31.
Figure 34D:
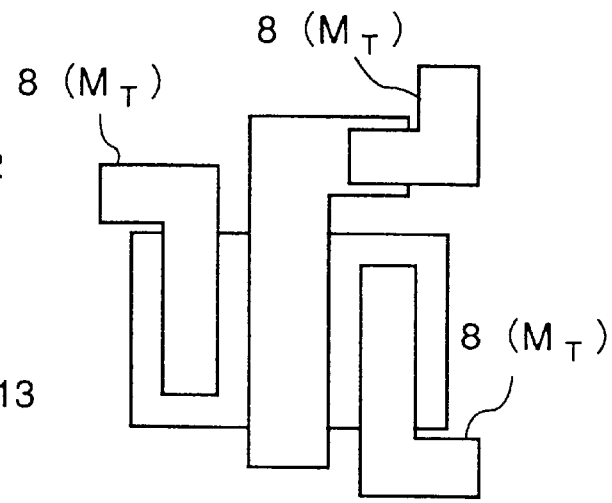
Figure 34B:
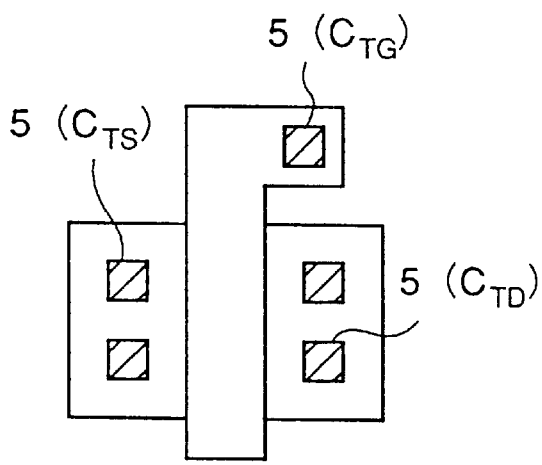
Figure 34C:
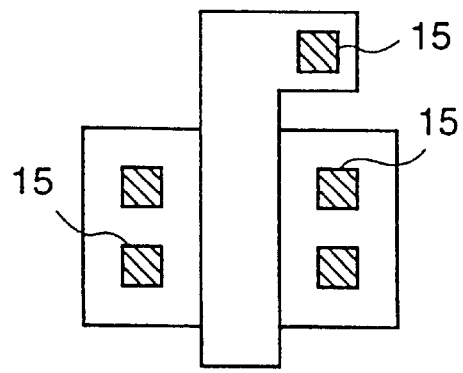

Next, in the peripheral transistor, as shown in FIGS. 34B and 36D, the conductive member 5 is formed in the source contact ($C_{TS}$), the drain contact ($C_{TD}$) and the gate contact ($C_{TG}$) (as is the case with the second embodiment).

Next, as shown in FIGS. 33, 34C and 37A to 37D, the conductive members 15 to be the electrodes are formed on the conductive member 4 corresponding to the bit line contact CB and the source line contact CS and on the contacts $C_{TS}$, $C_{TD}$ and $C_{TG}$ of the peripheral transistor, respectively.

As shown in FIGS. 31, 34D and 38A to 38D, the metal interconnection 8 is then patterned as the peripheral interconnection material. The metal interconnection 8 is composed of the low-resistance interconnection material such as Al. The bit line BL, the source line SL and the peripheral interconnection ($M_T$) are formed by the metal interconnection 8.

According to the method of manufacturing the semiconductor of the third embodiment, the bit line contact and the source line contact are not directly disposed through an electrode material such as the conductive member 6. Thus, the process is more simplified than the second embodiment described above.

Figure 39:
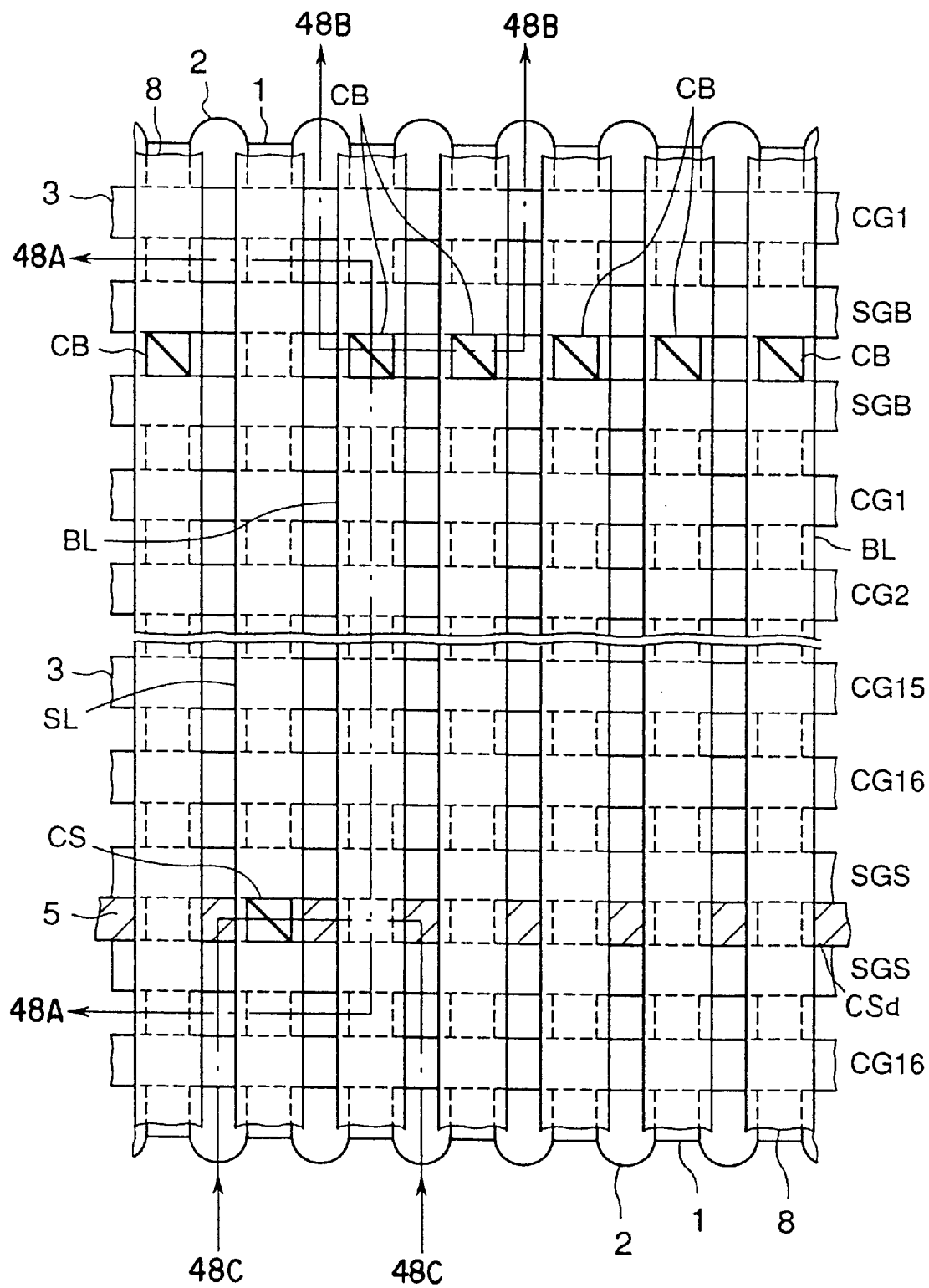
FIG. 39 is a plan view showing the partial arrangement of the memory cell array of the NAND type EEPROM according to a fourth embodiment of the present invention.
Figure 41:
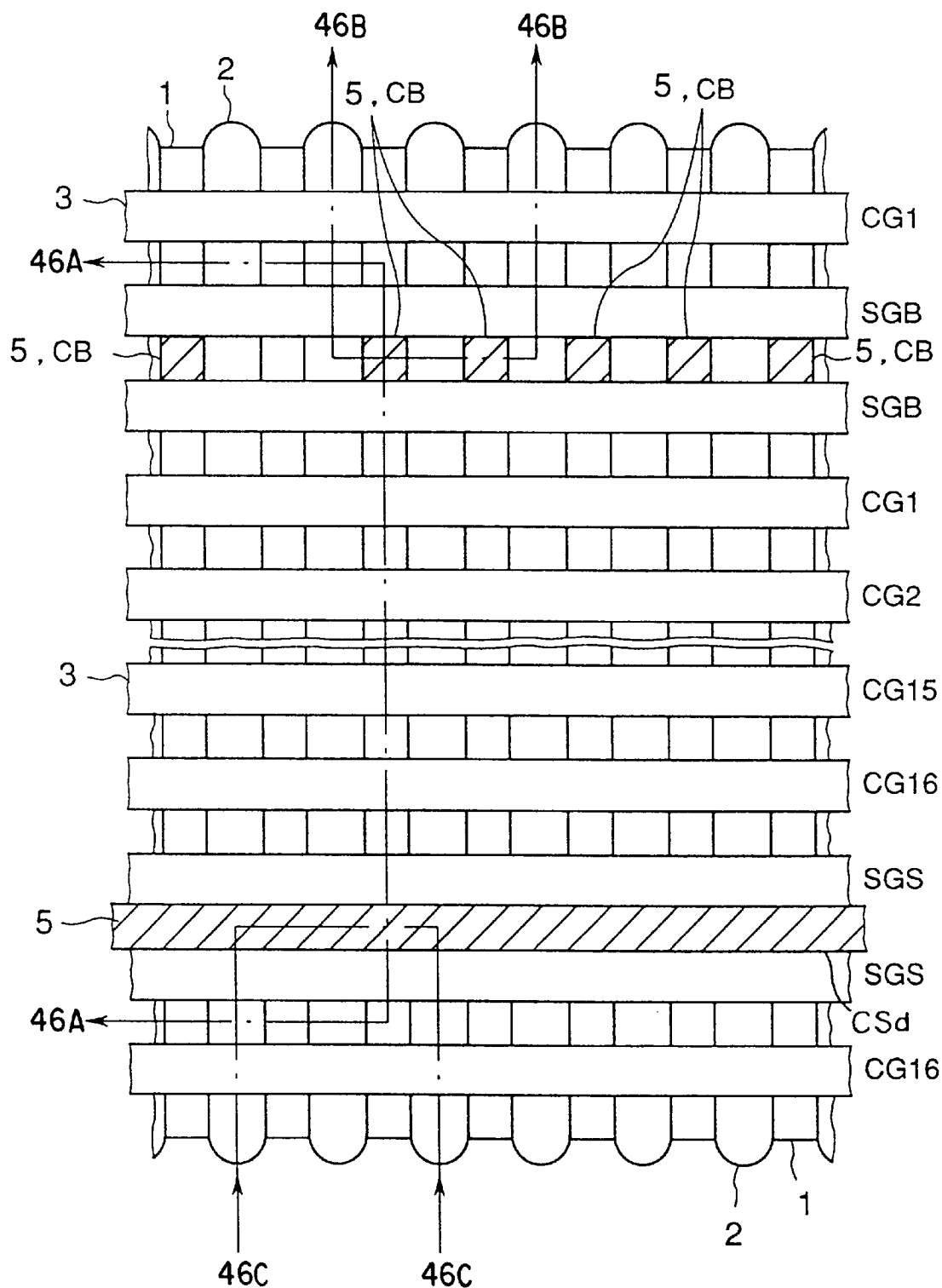
Figure 42:
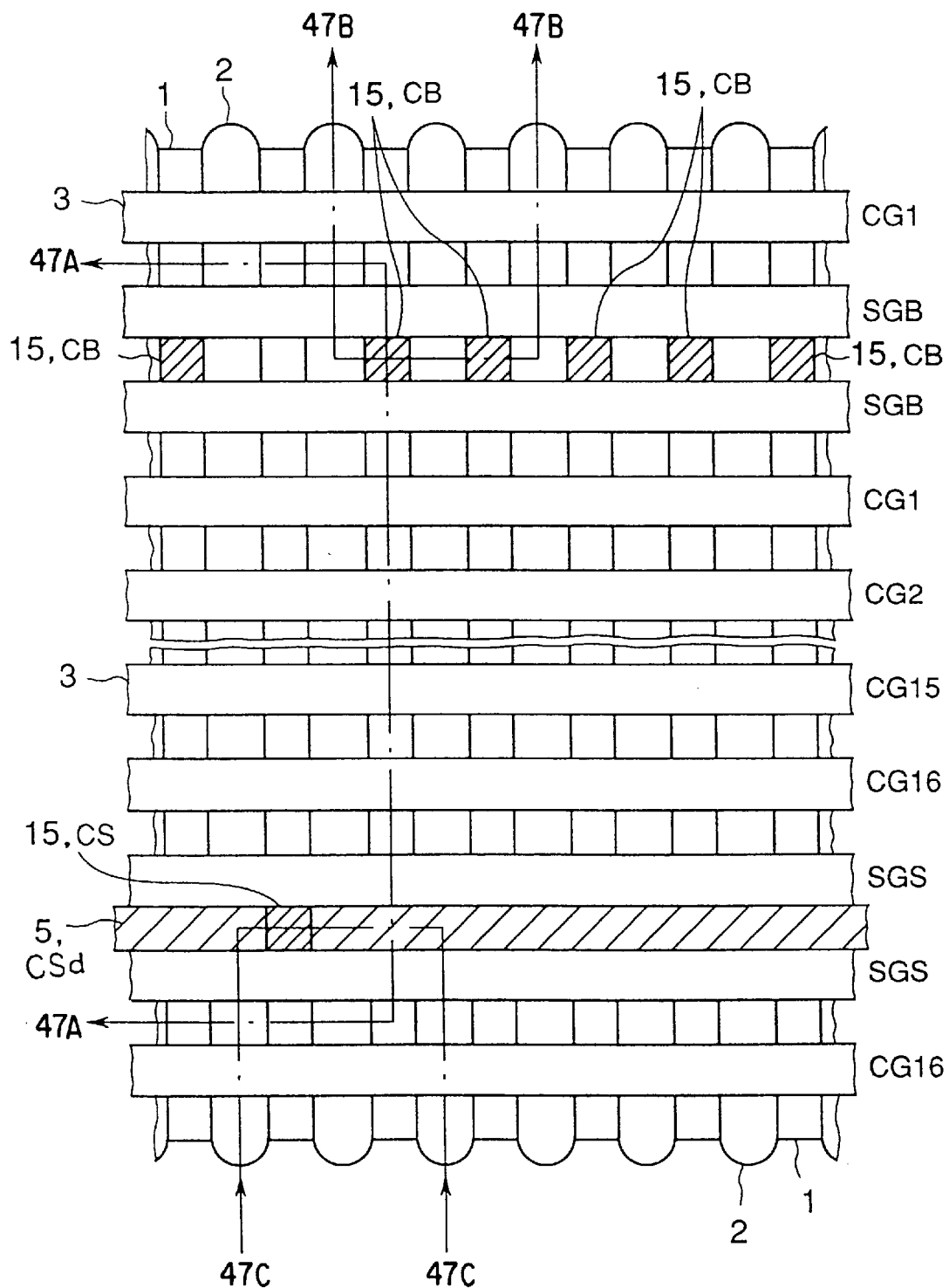

FIG. 39 is a plan view showing the partial arrangement of the memory cell array of the NAND type EEPROM according to a fourth embodiment of the present invention. FIGS. 40 to 42 are plan views sequentially showing the process of manufacturing the arrangement of FIG. 39. FIGS. 43A to 43D are plan views sequentially showing the process of manufacturing the peripheral transistor (MOS transistor) circuit formed together with the process of manufacturing the partial arrangement of the memory cell array shown in FIG. 39.

FIGS. 44A to 44C, 45A to 45C, 46A to 46C, 47A to 47C and 48A to 48C are cross sectional views sequentially showing the process of manufacturing the arrangement shown in FIG. 39, respectively, and correspond to the cross sectional views taken on lines of figure numbers shown in FIGS. 39 to 42.

FIGS. 44D, 45D, 46D, 47D and 48D are cross sectional views of the part corresponding to the manufacturing process shown in FIGS. 43A to 43D, respectively.

Referring to FIGS. 48A to 48D, the difference in the arrangement between the fourth embodiment and the third embodiment shown in FIG. 31 is mainly described with reference to FIG. 39.

In this embodiment, the low-resistance conductive member 5 for use in the earliest contact burying of the peripheral transistor is disposed on the upper portion of the first conductive member 4. This is the difference between the third and fourth embodiments. As described above, for example, the high-melting-point metal material such as tungsten W or the low-resistance metal material such as Al is suitable for the conductive member 5. The conductive member 5 allows the resistance between the diffusion source regions to be reduced. Others are the same as the third embodiment.

The method of manufacturing the arrangement of FIG. 39, mainly, the difference between the third and fourth embodiments will be described below. In the first place, reference is made to FIGS. 40 and 44A to 44D. In the same manner as FIG. 32, the bit line contact (CB) is formed. The opening 14 to be the source line contact CSd on the diffusion layer side is also formed. Next, the conductive member 4 is buried in the bit line contact CB and the opening 14. The conductive member 4 is formed by, for example, burying the N-type doped polycrystalline silicon or amorphous silicon.

The conductive member 4 is then flattened by the CMP (Chemical Mechanical Polishing) method. As shown in FIGS. 45A to 45D, the buried conductive member 4 is etched back by the use of, for example, the RIE (Reactive Ion Etching) method, whereby the height of burying is lowered.

Next, as shown in FIGS. 41, 43B and 46A to 46D, the contacts $C_{TS}$, $C_{TD}$ and $C_{TG}$ of the peripheral transistor are opened, whereby the conductive member 5 is buried.

At the same time, the conductive member 5 is buried on the conductive member 4 whose buried height is reduced by the previous etching back, that is, on the portion corresponding to the bit line contact CB and the opening 14 shown in FIG. 40. After a flat formation, the stacked structure of the conductive members 4 and 5 is formed in the bit line contact CB and the opening 14 (the source line contact CSd on the diffusion layer side).

Next, as shown in FIGS. 42, 43C and 47A to 47D, the conductive members 15 to be the electrodes are formed on the conductive member 5 corresponding to the bit line contact CB and the source line contact CS and on the contacts $C_{TS}$, $C_{TD}$ and $C_{TG}$ of the peripheral transistor, respectively.

As shown in FIGS. 39, 43D and 48A to 48D, the metal interconnection 8 is then patterned as the peripheral interconnection material. The metal interconnection 8 is composed of a low-resistance interconnection material such as Al. The bit line BL, the source line SL and the peripheral interconnection ($M_T$) are formed by the metal interconnection 8.

According to the manufacturing method of this embodiment, the resistance between the diffusion source regions is parallel to the resistance of the conductive members 4 and 5. As the conductive member 5 has the low resistance, the resistance can be reduced.

The present invention is not limited to the NAND type EEPROM alone shown in the above embodiments. An example will be described below.

Figure 49:
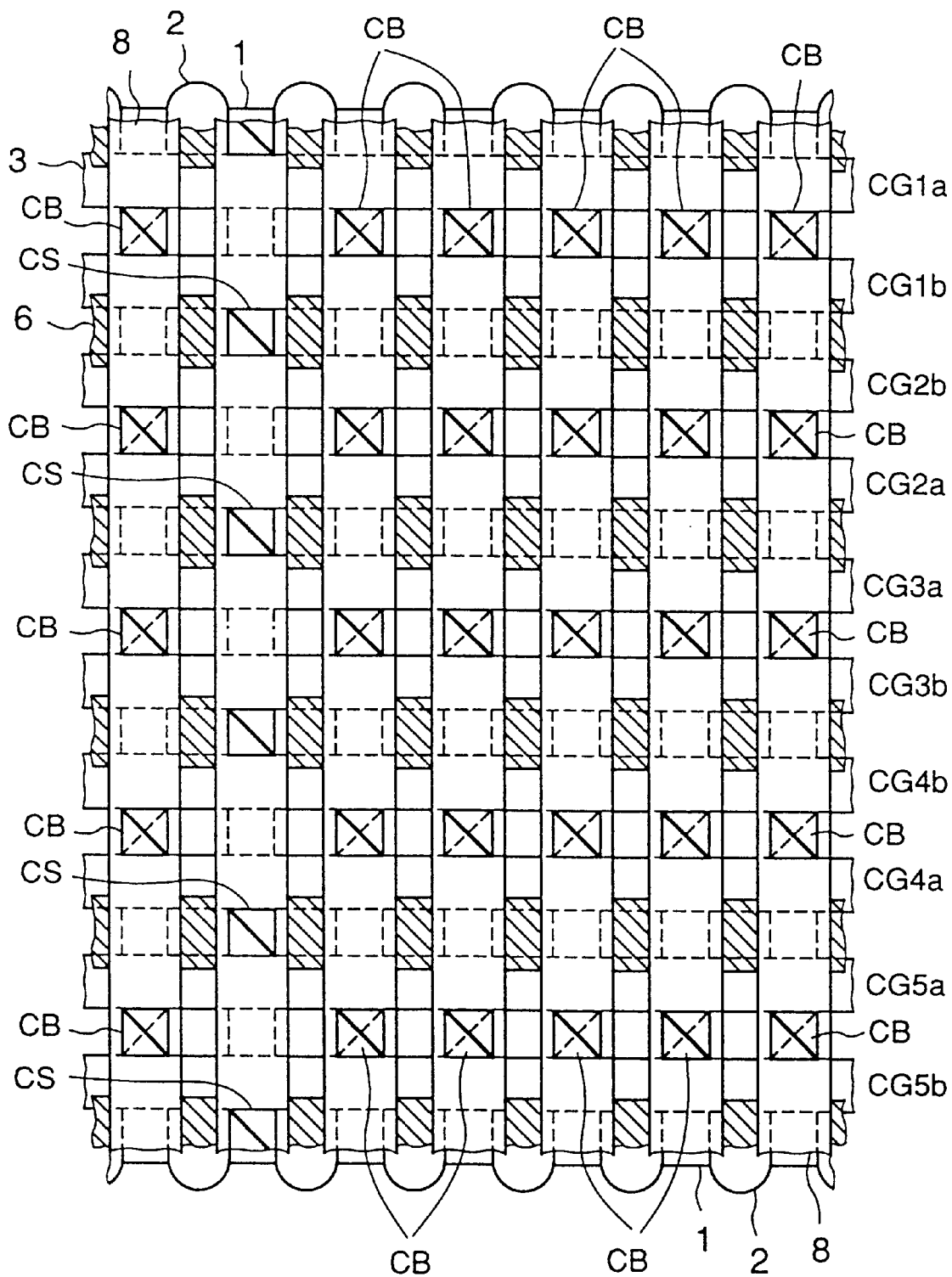
FIG. 49 shows a fifth embodiment of the present invention and is a plan view showing the partial arrangement of the memory cell array of a NOR type EEPROM arranged by applying the second embodiment.
Figure 51:
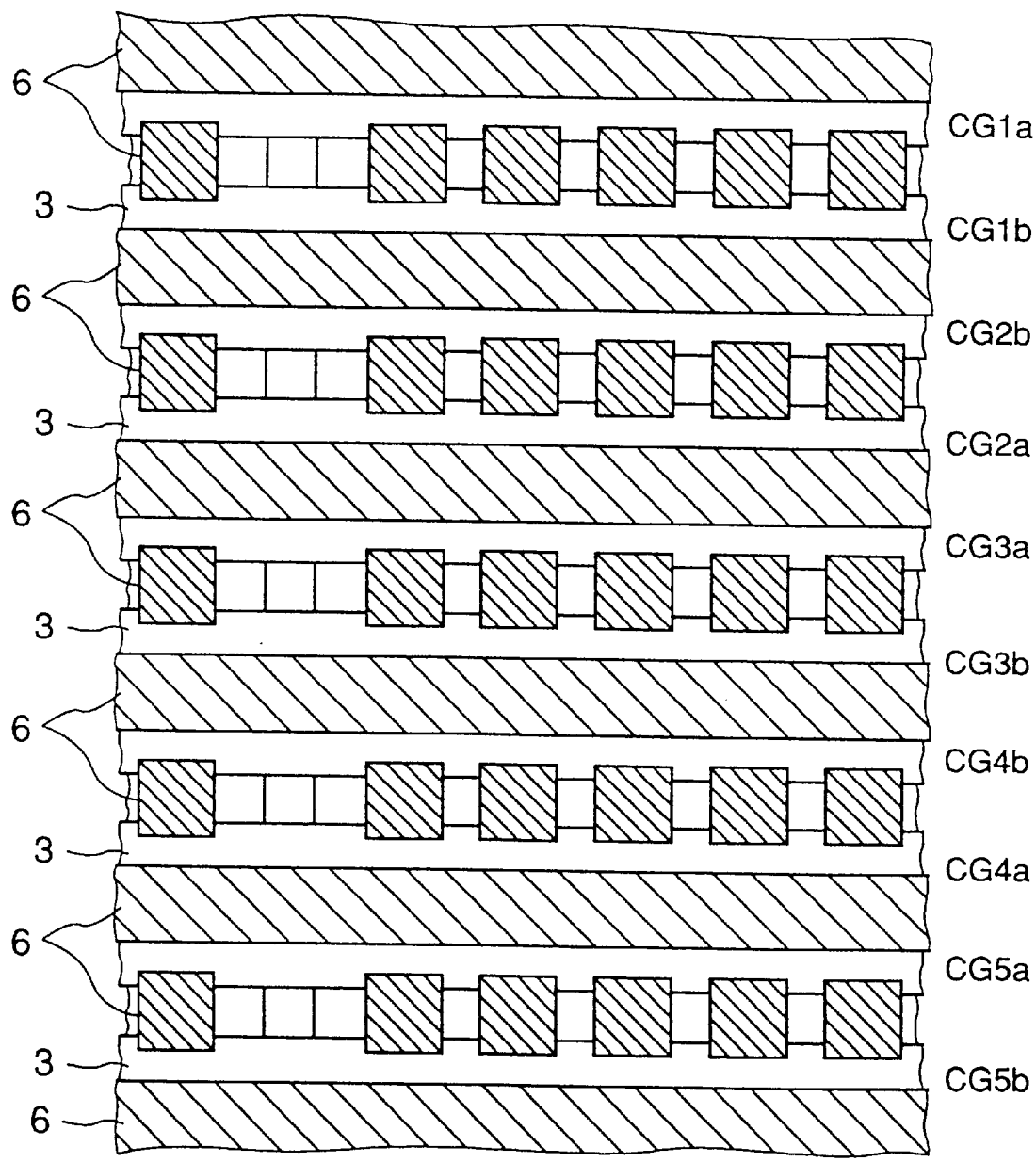
Figure 52:
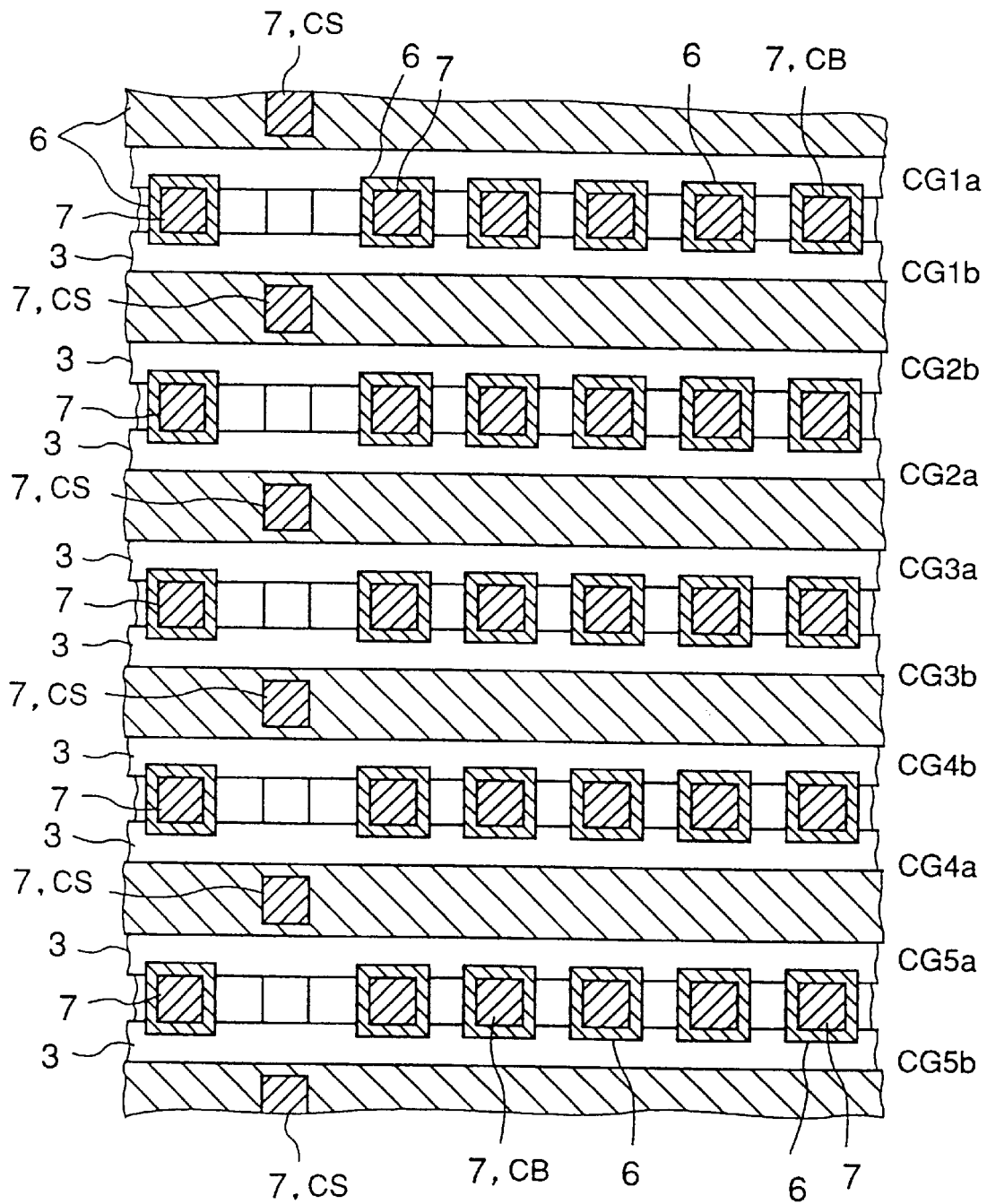

FIG. 49 shows a fifth embodiment of the present invention and is a plan view showing the partial arrangement of the memory cell array of a NOR type EEPROM arranged by applying the second embodiment. FIGS. 50 to 52 are plan views sequentially showing the process of manufacturing the arrangement of FIG. 49.

FIGS. 53A to 53E are plan views sequentially showing the process of manufacturing the peripheral transistor (MOS transistor) circuit formed together with the process of manufacturing the partial arrangement of the memory cell array shown in FIG. 49.

In the NOR type EEPROM, a single bit line contact CB is shared with two memory cells, for example, the memory cells in which CG1a and CG1b are used as the gate electrodes. A single source line is similarly connected to two memory cells, for example, the memory cells in which CG1b and CG2b are used as the gate electrodes.

In FIG. 49, in the source line contact CS, the conductive member 6 is led through the conductive member 7 shown in FIG. 52. Both the conductive members 6 and 7 are the metal members. The conductive member 6 is connected to the conductive member 4 shown in FIG. 50.

The conductive member 4 is buried along the gate electrodes and is connected to the diffusion source region. In each of the bit line contacts CB, the conductive member 6 is also led through the conductive member 7 in the same manner. The conductive member 6 is connected to the conductive member 4. The conductive member 4 is connected to the drain diffusion layer corresponding to the each of the bit line contacts CB.

The method of manufacturing the partial arrangement of the memory cell array shown in FIG. 49 will be described.

In the first place, as shown in FIG. 50, the bit line contact (CB) is formed. The opening 14 corresponding to the diffusion source region (the source line contact CSd on the diffusion layer side) is also formed. The conductive member 4 is then buried in the bit line contact CB and the opening 14. Every other conductive member 4, in which the source line contact CSd on the diffusion layer side is buried, is formed between the gate electrodes CG so that it may be arranged along the gate electrode CG.

Figure 53A:
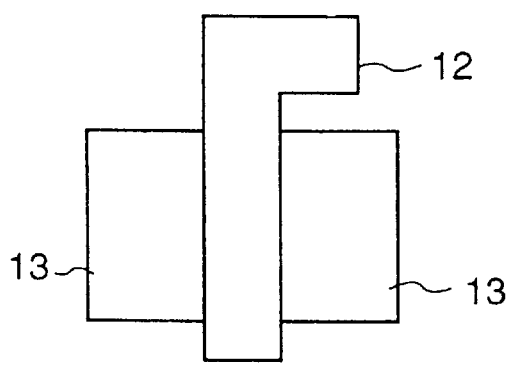
FIGS. 53A to 53E are plan views sequentially showing the process of manufacturing the peripheral transistor (MOS transistor) circuit formed together with the process of manufacturing the partial arrangement of the memory cell array shown in FIG. 49.
Figure 53D:
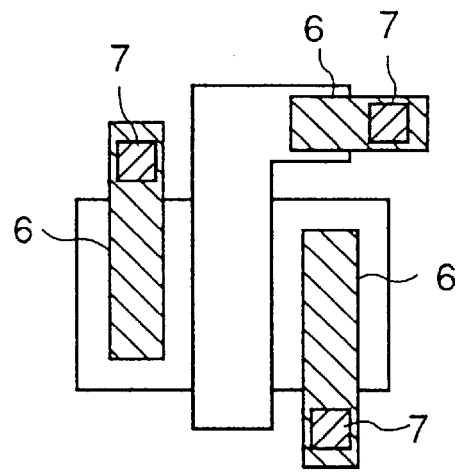
Figure 53B:
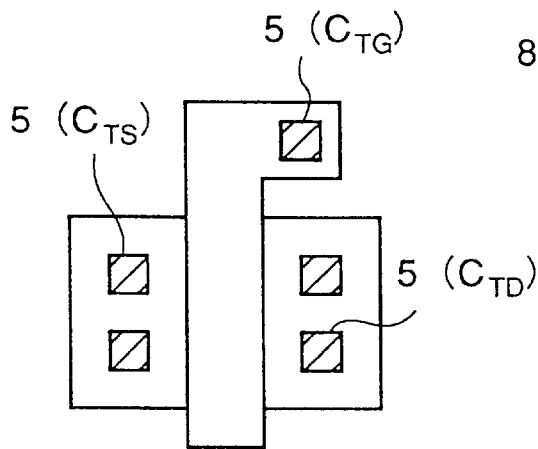

Next, in the peripheral transistor, as shown in FIG. 53B, the conductive member 5 is formed in the source contact ($C_{TS}$), the drain contact ($C_{TD}$) and the gate contact ($C_{TG}$).

Figure 53E:
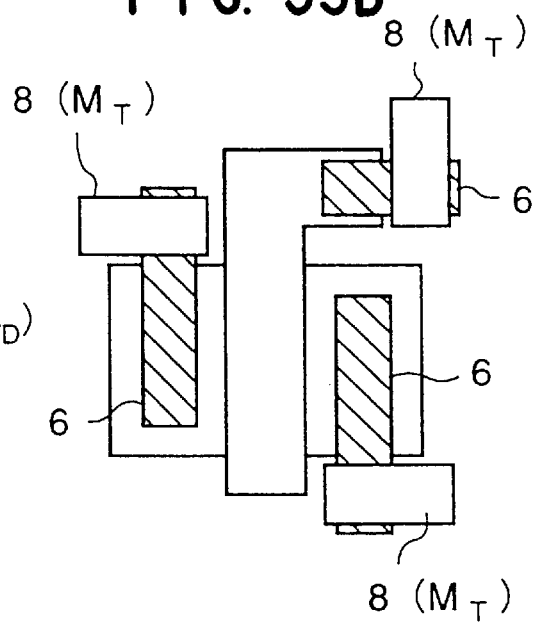
Figure 53C:
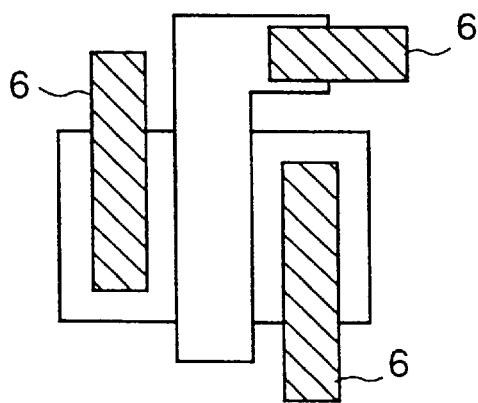

Next, as shown in FIGS. 51 and 53C, the conductive members 6 to be the electrodes are formed on the conductive member 4 in the bit line contact CB and the source line contact CSd on the diffusion layer side and on the contacts $C_{TS}$, $C_{TD}$ and $C_{TG}$ of the peripheral transistor, respectively.

Next, as shown in FIGS. 52 and 53D, the contacts (CS, CB) are selectively opened on the conductive member 6. The conductive member 7 is then formed in the openings. The contact portions of the peripheral transistor are also formed in the same manner.

As shown in FIGS. 49 and 53E, the metal interconnection 8 is then patterned as the peripheral interconnection material. As described above, the metal interconnection 8 is composed of the low-resistance interconnection material such as Al. The bit line BL, the source line SL and the peripheral interconnection ($M_T$) are formed by the metal interconnection 8.

According to the method of this embodiment, the diffusion source regions are connected to each other by the conductive members 4 and 6. Thus, the etching of the element separating film such as the SAS method is not required. Furthermore, the resistance can be reduced between the diffusion source regions.

The present invention is not limited to the above-described embodiments. It should be understood that various changes can be made in the present invention without departing from the spirit and scope of the present invention as defined by the appended claims.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor substrate of a first conductivity type;
    a first element separating region including a first trench formed on said semiconductor substrate and a first insulation layer buried in said first trench;
    a second element separating region including a second trench formed on said semiconductor substrate and a second insulating layer buried in said second trench;
    an element region arranged between said first and second element separating regions;
    a memory cell string arranged in said element region and having at least one memory cell;
    first and second contact plugs;
    a first source line configured to supply a predetermined voltage to said memory cell string via said first contact plug and being arranged in a direction crossing said element region, and said first and second element separating regions;

a bit line configured to transfer data from/to said memory cell string via said second contact plug, said bit line being arranged above said first source line in a direction parallel to said element region; and a second source line electrically connected to said first source line and arranged in a layer in which said bit line is formed in parallel with said second source line in a direction crossing said first source line.

2. The semiconductor device according to claim 1, wherein said memory cell includes a gate member having a charge storage layer and a control gate, and an insulating film between said charge storage layer and said control gate, said insulating film being one of an oxide film, a nitride film, an oxide nitride film and a stacked film of an oxide film and a nitride film.

3. The semiconductor device according to claim 2, wherein a periphery of said gate member is covered with an insulating layer.

4. The semiconductor device according to claim 1, wherein said memory cell string includes a plurality of memory cells serially connected between first and second select gate transistors, one end of said first select gate transistor being connected to said first source line via said first contact plug and one end of said second select gate transistor being connected to said bit line via said second contact plug.

5. The semiconductor device according to claim 1, wherein said first source line and said second source line are connected via a first conductive member, and said bit line and said second contact plug are connected via a second conductive member.

6. The semiconductor device according to claim 5, wherein said first and second conductive members are formed to have a substantially similar thickness.

7. The semiconductor device according to claim 1, wherein said first and second contact plugs are formed in an interlayer insulating film and said first source line is provided on a surface of said interlayer insulating film.

8. The semiconductor device according to claim 1, wherein said memory cell has a source region and a drain region formed in said element region and said first and second contact plugs are connected to said source region and said drain region.

9. The semiconductor device according to claim 1, wherein said first source line has a layer thickness smaller than a layer thickness of said first contact plug.

10. The semiconductor device according to claim 1, wherein said first source line has a resistivity lower than a resistivity of said first contact plug.

11. The semiconductor device according to claim 1, wherein said first source line is a metal member.

12. The semiconductor device according to claim 1, further comprising at least one transistor configure to arrange a peripheral circuit for driving said memory cell string.

13. The semiconductor device according to claim 1, wherein said first contact plug is formed continuously in a direction of said first source line over at least one of said first and second element separating regions so as to connect a first source region of said memory cell in said memory cell string and a second source region of a memory cell in an adjacent memory cell string.

14. The semiconductor device comprising:
a semiconductor substrate of a first conductivity type;
a first element separating region including a first trench formed on said semiconductor substrate and a first insulation layer buried in said first trench;

a second element separating region including a second trench formed on said semiconductor substrate and a second insulating layer buried in said second trench;

a third element separating region including a third trench formed on said semiconductor substrate and a third insulating layer buried in said third trench;

a first element region arranged between said first and second element separating regions;

a second element region arranged between said second and third element separating regions;

a first memory cell string arranged in said first element region and having at least one memory cell;

a second memory cell string arranged in said second element region and having at least one memory cell;

first, second, third and fourth contact plugs;

a first source line configured to supply a predetermined voltage to said first and second memory cell strings via said first and third contact plugs and being arranged in a direction crossing said first and second element regions, and said first, second and third element separating regions;

a first bit line configured to transfer data from/to said first memory cell string via said second contact plug, said first bit line being arranged above said first source line in a direction parallel to said first and second element regions;

a second bit line configured to transfer data from/to said second memory cell string via said fourth contact plug, said second bit line being arranged above said first source line in a direction parallel to said first and second element regions; and a second source line provided in common with said first and second bit lines to be electrically connected to said first source line, said second source line being arranged in a layer in which said first and second bit lines are formed in parallel with said second source line in a direction crossing said first source line.

15. A semiconductor device comprising:
a semiconductor substrate of a first conductivity type;
a first element separating region including a first trench formed on said semiconductor substrate and a first insulation layer buried in said first trench;

a second element separating region including a second trench formed on said semiconductor substrate and a second insulating layer buried in said second trench;

an element region arranged between said first and second element separating regions;

a memory cell string arranged in said element region and having at least one memory cell;

a first contact plug;

a conductive member configured to supply a predetermined voltage to said memory cell string and being arranged in a direction crossing said element region, and said first and second element separating regions;

a bit line configured to transfer data from/to said memory cell string via said first contact plug, said bit line being arranged above said conductive member in a direction parallel to said element region; and a source line electrically connected to said conductive member and arranged in a layer in which said bit line is formed in parallel with said source line in a direction crossing said conductive member.

* * * * *